(12) United States Patent
Matsuzaki et al.

(10) Patent No.: US 11,973,198 B2
(45) Date of Patent: Apr. 30, 2024

(54) DEVICE DETECTING ABNORMALITY OF SECONDARY BATTERY AND SEMICONDUCTOR DEVICE

(71) Applicant: Semiconductor Energy Laboratory Co., Ltd., Atsugi (JP)

(72) Inventors: Takanori Matsuzaki, Atsugi (JP); Kei Takahashi, Isehara (JP); Takahiko Ishizu, Sagamihara (JP); Yuki Okamoto, Isehara (JP); Minato Ito, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 490 days.

(21) Appl. No.: 17/291,000

(22) PCT Filed: Nov. 11, 2019

(86) PCT No.: PCT/IB2019/059650
§ 371 (c)(1),
(2) Date: May 4, 2021

(87) PCT Pub. No.: WO2020/104885
PCT Pub. Date: May 28, 2020

(65) Prior Publication Data
US 2022/0045370 A1    Feb. 10, 2022

(30) Foreign Application Priority Data

Nov. 22, 2018 (JP) .................... 2018-218885
Dec. 21, 2018 (JP) .................... 2018-240093

(51) Int. Cl.
*H03K 5/00*    (2006.01)
*H01M 10/42*    (2006.01)
(Continued)

(52) U.S. Cl.
CPC ....... *H01M 10/425* (2013.01); *H01M 50/569* (2021.01); *H02J 7/0031* (2013.01);
(Continued)

(58) Field of Classification Search
CPC .......... H03K 5/01; H03K 5/24; H03K 5/2472; H03K 5/2427; H01M 10/425; H02J 7/0031
See application file for complete search history.

(56) References Cited

U.S. PATENT DOCUMENTS 4,672,238 A    6/1987 Nemoto
5,329,171 A *  7/1994 Shimizu ............... H03K 5/2481
                                                    327/78
(Continued)

FOREIGN PATENT DOCUMENTS

CN    101171678 A    4/2008
CN    101394168 A    3/2009
(Continued)

OTHER PUBLICATIONS

International Search Report (Application No. PCT/IB2019/059650) dated Jan. 28, 2020.
(Continued)

*Primary Examiner* — Tuan T Lam
(74) *Attorney, Agent, or Firm* — Eric J. Robinson; Robinson Intellectual Property Law Office, P.C.

(57) ABSTRACT

A semiconductor device capable of detecting a micro-short circuit of a secondary battery is provided. The semiconductor device includes a first source follower, a second source follower, a transistor, a capacitor, and a comparator. A negative electrode potential and a positive electrode potential of the secondary battery are supplied to the semiconductor device, a first potential is input to the first source follower, and a second potential is input to the second source follower
(Continued)

follower. A signal for controlling the conduction state of the transistor is input to a gate of the transistor, and an output potential of the first source follower related to the potential between the positive electrode and the negative electrode of the secondary battery is sampled. The comparator compares the sampled potential with an output potential of the second source follower, whereby the semiconductor device can deal with a secondary battery in which the potential between the positive electrode and the negative electrode is changed by charge and discharge.

12 Claims, 12 Drawing Sheets

(51) Int. Cl.
  *H01M 50/569* (2021.01)
  *H02J 7/00* (2006.01)
  *H03K 5/01* (2006.01)
  *H03K 5/24* (2006.01)

(52) U.S. Cl.
  CPC .............. *H03K 5/01* (2013.01); *H03K 5/24* (2013.01); *H01M 2010/4271* (2013.01); *H03K 5/2427* (2013.01); *H03K 5/2472* (2013.01)

(56) References Cited

U.S. PATENT DOCUMENTS

| | | | |
|---|---|---|---|
| 5,426,616 A * | 6/1995 | Kajigaya | G11C 5/147 |
| | | | 307/64 |
| 5,589,785 A | 12/1996 | Garavan | |
| 5,600,275 A | 2/1997 | Garavan | |
| 5,625,304 A | 4/1997 | Azadet et al. | |
| 5,677,643 A * | 10/1997 | Tomita | G01R 31/3004 |
| | | | 327/437 |
| 6,191,624 B1 | 2/2001 | Matsuya | |
| 6,586,984 B1 * | 7/2003 | Radke | H03K 5/08 |
| | | | 327/309 |
| 6,940,318 B1 * | 9/2005 | Wong | H03K 5/2472 |
| | | | 327/78 |
| 7,049,865 B2 * | 5/2006 | Parker | H03K 17/223 |
| | | | 327/143 |
| 7,123,093 B2 | 10/2006 | Hamamoto | |
| 7,466,171 B2 * | 12/2008 | Abadeer | H03K 5/153 |
| | | | 327/143 |
| 7,830,182 B2 | 11/2010 | Suzuki et al. | |
| 8,508,967 B2 | 8/2013 | Yamazaki et al. | |
| 8,653,865 B2 * | 2/2014 | Utsuno | G06F 1/28 |
| | | | 327/51 |
| 8,749,204 B2 | 6/2014 | Majima et al. | |
| 8,861,288 B2 | 10/2014 | Ohshima | |
| 9,160,195 B2 | 10/2015 | Takahashi et al. | |
| 9,245,650 B2 | 1/2016 | Inoue et al. | |
| 9,391,598 B2 | 7/2016 | Inoue et al. | |
| 9,453,886 B2 | 9/2016 | Makino et al. | |
| 10,128,821 B2 | 11/2018 | Nallamothu | |
| 10,541,677 B2 | 1/2020 | Nallamothu | |
| 2005/0179490 A1 | 8/2005 | Hamamoto | |
| 2009/0102516 A1 | 4/2009 | Suzuki et al. | |
| 2009/0128219 A1 | 5/2009 | Umemoto | |
| 2011/0267726 A1 | 11/2011 | Ikeuchi et al. | |
| 2014/0021904 A1 | 1/2014 | Takahashi et al. | |
| 2014/0266379 A1 | 9/2014 | Inoue et al. | |
| 2016/0377685 A1 | 12/2016 | Makino et al. | |
| 2017/0250680 A1 | 8/2017 | Yamamoto | |
| 2017/0353188 A1 | 12/2017 | Saeki et al. | |
| 2021/0126473 A1 | 4/2021 | Ikeda et al. | |
| 2021/0384906 A1 * | 12/2021 | Takahashi | H03K 19/0944 |

FOREIGN PATENT DOCUMENTS

| | | |
|---|---|---|
| CN | 103178826 A | 6/2013 |
| CN | 103492888 A | 1/2014 |
| CN | 103545873 A | 1/2014 |
| CN | 107463199 A | 12/2017 |
| CN | 207490875 U | 6/2018 |
| DE | 000069519091 | 5/2001 |
| DE | 102013214043 | 1/2014 |
| EP | 0188221 A | 7/1986 |
| EP | 0739092 A | 10/1996 |
| EP | 0996226 A | 4/2000 |
| EP | 0757857 B | 10/2000 |
| EP | 2700958 A | 2/2014 |
| JP | 58-088674 A | 5/1983 |
| JP | 61-159815 A | 7/1986 |
| JP | 08-307167 A | 11/1996 |
| JP | 09-512684 | 12/1997 |
| JP | 2000-196421 A | 7/2000 |
| JP | 2005-229383 A | 8/2005 |
| JP | 2009-077003 A | 4/2009 |
| JP | 2009-135889 A | 6/2009 |
| JP | 2010-066161 A | 3/2010 |
| JP | 2012-256820 A | 12/2012 |
| JP | 2014-039459 A | 2/2014 |
| JP | 2015-122750 A | 7/2015 |
| JP | 2018-156699 A | 10/2018 |
| KR | 1996-0039643 A | 11/1996 |
| KR | 2009-0030240 A | 3/2009 |
| KR | 2014-0010896 A | 1/2014 |
| KR | 2014-0113388 A | 9/2014 |
| TW | 293970 | 12/1996 |
| TW | 200937867 | 9/2009 |
| TW | 201442434 | 11/2014 |
| WO | WO-1995/030271 | 11/1995 |

OTHER PUBLICATIONS

Written Opinion (Application No. PCT/IB2019/059650) dated Jan. 28, 2020.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

* cited by examiner

100

50

50

51

51

51

DEVICE DETECTING ABNORMALITY OF SECONDARY BATTERY AND SEMICONDUCTOR DEVICE

TECHNICAL FIELD

One embodiment of the present invention relates to a device detecting an abnormality of a secondary battery. The abnormality detection device disclosed in this specification and the like is a semiconductor device and specifically has a function of detecting a micro-short circuit of a secondary battery.

In this specification and the like, a semiconductor device refers to all devices that can function by utilizing semiconductor characteristics. For example, a transistor, a semiconductor circuit, an integrated circuit, a chip including an integrated circuit, an electronic component including a packaged chip, and an electronic device including an integrated circuit are examples of semiconductor devices.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter.

BACKGROUND ART

Small and lightweight secondary batteries (secondary batteries with high energy density) have been actively developed in recent years. Among secondary batteries, lithium-ion batteries, which have high output power and high energy density, are used in a wide range of applications such as portable information terminals such as mobile phones, smartphones, tablets, and laptop personal computers, clean-energy automobiles such as hybrid energy vehicles (HEVs), plug-in hybrid energy vehicles (PHEVs), and electric vehicles (EVs), digital cameras, portable music players, and medical devices, and lithium-ion batteries are essential as energy supply sources in the modern society.

A secondary battery may be provided with a device that protects and controls the battery, a device that detects an abnormality of the battery (an abnormality detection device), and the like. The abnormality detection device obtains data on voltage, current, and the like of the battery; when detecting an abnormality such as overcharge, overdischarge, overcurrent, or a short circuit, the abnormality detection device outputs an abnormality detection signal and takes measures such as termination of charge and discharge.

Patent Document 1 discloses a protective IC that functions as a battery protection circuit. The protective IC described in Patent Document 1 has a structure where a plurality of comparators are provided inside, and a reference voltage and a voltage of a terminal to which a battery is connected are compared to detect an abnormality at charge and discharge. Patent Document 2 discloses a battery state detection device that detects a micro-short circuit of a secondary battery and a battery pack incorporating the same.

Meanwhile, a transistor including a metal oxide in a channel formation region (also referred to as oxide semiconductor transistor or OS transistor) has been attracting attention. As an OS transistor, an n-channel transistor has been in practical use, and an OS transistor has the following features, for example: it has an extremely low off-state current; high voltage can be applied between a source and a drain (i.e., it has high withstand voltage); and it can be stacked because it is a thin film transistor. Furthermore, an OS transistor has the following features: the off-state current is less likely to increase even in a high-temperature environment, and the ratio of on-state current to off-state current is high even in a high-temperature environment; thus, a semiconductor device formed using an OS transistor has high reliability.

For example, Patent Document 3 discloses a semiconductor device including a plurality of memory cells using OS transistors over a semiconductor substrate where peripheral circuits such as a driver circuit and a control circuit are formed, and an example in which an OS transistor is used in a memory cell of a DRAM (Dynamic Random Access Memory). For example, a peripheral circuit can be formed using a Si transistor formed on a single crystal silicon substrate, and a memory cell using an OS transistor can be stacked thereabove. The memory cell using an OS transistor is provided over the single crystal silicon substrate where the peripheral circuit is formed, achieving features of a reduction in chip area and long-term retention of stored data due to extremely low off-state current of the OS transistor.

In addition, not only single-component metal oxides, such as indium oxide and zinc oxide, but also multi-component metal oxides are known as oxide semiconductors, for example. Among the multi-component metal oxides, in particular, an In—Ga—Zn oxide (also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3).

Non-Patent Document 1 and Non-Patent Document 2 disclose a technique for fabricating a transistor using an oxide semiconductor having the CAAC structure. Moreover, Non-Patent Document 4 and Non-Patent Document 5 disclose that a fine crystal is included even in an oxide semiconductor which has lower crystallinity than an oxide semiconductor having the CAAC structure or the nc structure.

Non-Patent Document 6 reports the extremely low off-state current of a transistor using an oxide semiconductor, and Non-Patent Document 7 and Non-Patent Document 8 report an LSI (Large Scale Integration) and a display that utilize such a property of extremely low off-state current.

REFERENCE

Patent Document

[Patent Document 1] Specification of United States Patent Application Publication No. 2011-267726
[Patent Document 2] Japanese Published Patent Application No. 2010-66161 [Patent Document 3] Japanese Published Patent Application No. 2012-256820

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

A micro-short circuit refers to a minute short circuit inside a secondary battery. A micro-short circuit is not a short circuit of the positive electrode and the negative electrode of a secondary battery which makes charging and discharging impossible, but a phenomenon in which a short-circuit current flows through a minute short-circuited portion for a short period.

A micro-short circuit is presumably caused in the following manner: when a plurality of charging and discharging operations are performed, a metal element such as lithium or cobalt is precipitated in the battery, the growth of the precipitate causes a local current concentration in part of the positive electrode and part of the negative electrode, and the function of a separator partially stops or a by-product is generated.

There is a possibility that repeated micro-short circuits would lead to serious accidents such as abnormal heat generation, a fire, and an explosion of a secondary battery; hence, it is preferable to discover a micro-short circuit promptly, and battery control is required to reduce the risk of serious accidents.

However, a micro-short circuit is difficult to detect because it is instantaneous and a change in potential between the positive electrode and the negative electrode of a secondary battery is often small. Furthermore, in a lithium-ion battery, for example, a potential between the positive electrode and the negative electrode is changed by charge and discharge; thus, a mechanism for referring to a potential between the positive electrode and the negative electrode before the occurrence of a micro-short circuit is required.

An object of one embodiment of the present invention is to provide a semiconductor device capable of detecting a micro-short circuit of a secondary battery. Another object of one embodiment of the present invention is to provide a semiconductor device capable of dealing with a change in potential between a positive electrode and a negative electrode due to charge and discharge and detecting a micro-short circuit of a secondary battery.

Note that one embodiment of the present invention does not necessarily achieve all the above objects and only needs to achieve at least one of the objects. The description of the above objects does not preclude the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is a semiconductor device including a first source follower, a second source follower, a transistor, a capacitor, and a comparator. A first potential is input to the first source follower, a second potential is input to the second source follower, and an output of the first source follower is input to one of a source and a drain of the transistor. The other of the source and the drain of the transistor is electrically connected to one terminal of the capacitor and a non-inverting input terminal of the comparator, and an output of the second source follower is input to an inverting input terminal of the comparator.

One embodiment of the present invention is a semiconductor device including a first source follower, a second source follower, a transistor, a capacitor, and a comparator. A first potential is input to the first source follower, a second potential is input to the second source follower, the first potential is higher than the second potential, and an output of the first source follower is input to one of a source and a drain of the transistor. The other of the source and the drain of the transistor is electrically connected to one terminal of the capacitor and a non-inverting input terminal of the comparator, and an output of the second source follower is input to an inverting input terminal of the comparator.

One embodiment of the present invention is a semiconductor device including a first source follower, a second source follower, a transistor, a capacitor, and a comparator. A negative electrode potential of a secondary battery and a positive electrode potential of the secondary battery are supplied to the semiconductor device; a first potential is input to the first source follower; a second potential is input to the second source follower; the first potential is higher than the second potential; and the second potential is higher than the negative electrode potential. An output of the first source follower is input to one of a source and a drain of the transistor; the other of the source and the drain of the transistor is electrically connected to one terminal of the capacitor and a non-inverting input terminal of the comparator; and an output of the second source follower is input to an inverting input terminal of the comparator.

In the above embodiment, the transistor includes a metal oxide in a channel formation region.

In the above embodiment, the transistor, a transistor included in the first source follower, a transistor included in the second source follower, and a transistor included in the comparator each include a metal oxide in a channel formation region.

One embodiment of the present invention is a semiconductor device including first to fifth transistors, a capacitor, a comparator, and first and second wirings. One of a source and a drain of the first transistor is electrically connected to the first wiring; the other of the source and the drain of the first transistor is electrically connected to one of a source and a drain of the second transistor and one of a source and a drain of the fifth transistor; a first potential is input to a gate of the first transistor; and the other of the source and the drain of the second transistor and a gate of the second transistor are electrically connected to the second wiring. One of a source and a drain of the third transistor is electrically connected to the first wiring; the other of the source and the drain of the third transistor is electrically connected to one of a source and a drain of the fourth transistor and an inverting input terminal of the comparator; a second potential is input to a gate of the third transistor; and the other of the source and the drain of the fourth transistor and a gate of the fourth transistor are electrically connected to the second wiring. The other of the source and the drain of the fifth transistor is electrically connected to one terminal of the capacitor and a non-inverting input terminal of the comparator.

One embodiment of the present invention is a semiconductor device including first to fifth transistors, a capacitor, a comparator, and first and second wirings. One of a source and a drain of the first transistor is electrically connected to the first wiring; the other of the source and the drain of the first transistor is electrically connected to one of a source and a drain of the second transistor and one of a source and a drain of the fifth transistor; a first potential is input to a gate of the first transistor; and the other of the source and the drain of the second transistor and a gate of the second transistor are electrically connected to the second wiring. One of a source and a drain of the third transistor is electrically connected to the first wiring; the other of the source and the drain of the third transistor is electrically connected to one of a source and a drain of the fourth transistor and an inverting input terminal of the comparator; a second potential is input to a gate of the third transistor; and the other of the source and the drain of the fourth transistor and a gate of the fourth transistor are electrically connected to the second wiring. The other of the source and the drain of the fifth transistor is electrically connected to one terminal of the capacitor and a non-inverting input terminal of the comparator, and the first potential is higher than the second potential.

One embodiment of the present invention is a semiconductor device including first to fifth transistors, a capacitor, a comparator, and first and second wirings. One of a source and a drain of the first transistor is electrically connected to the first wiring; the other of the source and the drain of the first transistor is electrically connected to one of a source and a drain of the second transistor and one of a source and a drain of the fifth transistor; a first potential is input to a gate of the first transistor; and the other of the source and the drain of the second transistor and a gate of the second transistor are electrically connected to the second wiring. One of a source and a drain of the third transistor is electrically connected to the first wiring; the other of the source and the drain of the third transistor is electrically connected to one of a source and a drain of the fourth transistor and an inverting input terminal of the comparator; a second potential is input to a gate of the third transistor; and the other of the source and the drain of the fourth transistor and a gate of the fourth transistor are electrically connected to the second wiring. The other of the source and the drain of the fifth transistor is electrically connected to one terminal of the capacitor and a non-inverting input terminal of the comparator; a negative electrode potential of a secondary battery is supplied to the first wiring; a positive electrode potential of the secondary battery is supplied to the second wiring; the first potential is higher than the second potential; and the second potential is higher than the negative electrode potential.

In the above embodiment, the fifth transistor includes a metal oxide in a channel formation region.

In the above embodiment, the first to fifth transistors and a transistor included in the comparator each include a metal oxide in a channel formation region.

Effect of the Invention

One embodiment of the present invention can provide a semiconductor device capable of detecting a micro-short circuit of a secondary battery. Alternatively, one embodiment of the present invention can provide a semiconductor device capable of dealing with a change in potential between a positive electrode and a negative electrode due to charge and discharge and detecting a micro-short circuit of a secondary battery.

Note that the description of these effects does not preclude the existence of other effects. One embodiment of the present invention does not necessarily have all these effects. Effects other than these will be apparent from the description of the specification, the claims, the drawings, and the like, and effects other than these can be derived from the description of the specification, the claims, the drawings, and the like.

MODE FOR CARRYING OUT THE INVENTION

Figure 1A:
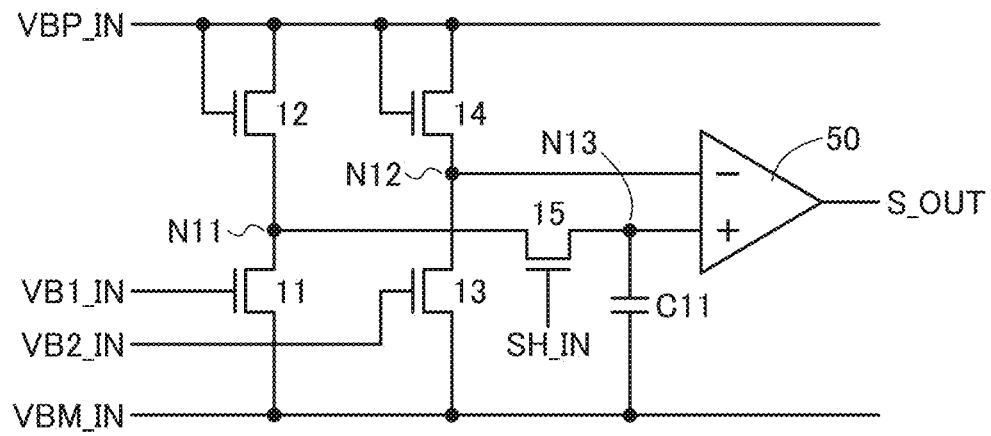
FIG. 1A is a circuit diagram illustrating a configuration example of a semiconductor device.

Hereinafter, embodiments will be described with reference to the drawings. Note that the embodiments can be implemented with many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to those shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement, such as "over" and "under", do not necessarily mean "directly over" and "directly under", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Functions of a source and a drain might be switched when a transistor of opposite polarity is employed or a direction of current flow is changed in circuit operation, for example. Thus, the terms of a source and a drain are interchangeable for use in this specification and the like.

Unless otherwise specified, off-state current in this specification and the like refers to drain current of a transistor in an off state (also referred to as a non-conducting state or a cutoff state). Unless otherwise specified, the off state of an n-channel transistor refers to a state where voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to source current when a transistor is in an off state. In addition, leakage current sometimes expresses the same meaning as off-state current. Furthermore, in this specification and the like, the off-state current sometimes refers to current that flows between a source and a drain when a transistor is in an off state.

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, a configuration example of a semiconductor device according to one embodiment of the present invention will be described. The semiconductor device according to one embodiment of the present invention has a function of detecting a spontaneous potential change (here, potential decrease) due to a micro-short circuit in a secondary battery during charge and discharge by sampling (obtaining) a potential between the positive electrode and the negative electrode of the secondary battery at fixed intervals and comparing the sampled potential with a post-sampling potential between the positive electrode and the negative electrode. By repeating sampling at fixed intervals, the semiconductor device can deal with a potential change in the secondary battery during charge and discharge, and can be operated using the potential between the positive electrode and the negative electrode of the secondary battery.

Note that in this embodiment, potential changes in a secondary battery and a semiconductor device during charging of the secondary battery will be described using timing charts and the like. Potential changes during discharging are easily understood by those skilled in the art, and therefore, the description thereof is omitted.

Configuration Example of Semiconductor Device

FIG. 1A is a circuit diagram illustrating a configuration example of a semiconductor device 100. The semiconductor device 100 includes a transistor 11 to a transistor 15, a capacitor C11, and a comparator 50. Note that in the drawings described in this specification and the like, the flow of main signals is indicated by an arrow or a line, and a power supply line and the like are omitted in some cases.

The semiconductor device 100 includes a wiring VBM_IN supplied with a negative electrode potential VBM of a secondary battery (not illustrated), a wiring VBP_IN supplied with a positive electrode potential VBP of the secondary battery, a wiring VB1_IN supplied with a predetermined potential VB1, a wiring VB2_IN supplied with a predetermined potential VB2, a wiring SH_IN supplied with a sampling signal SH, and an output terminal S_OUT.

Here, the predetermined potential VB1 is higher than the predetermined potential VB2, and the predetermined potential VB2 is higher than the negative electrode potential VBM. In the semiconductor device 100, the positive electrode potential VBP is a high power supply potential, the negative electrode potential VBM is a low power supply potential, and the negative electrode potential VBM may be referred to as a reference potential.

The transistor 11 to the transistor 15 are n-channel transistors. Although an example in which the semiconductor device 100 is formed using n-channel transistors is described in this specification and the like, p-channel transistors may alternatively be used. It will be easily understood by those skilled in the art that n-channel transistors in a circuit diagram configured using the n-channel transistors can be replaced with p-channel transistors; thus, the description is omitted.

In the semiconductor device 100, one of a source and a drain of the transistor 11 is electrically connected to the wiring VBM_IN; the other of the source and the drain of the transistor 11 is electrically connected to one of a source and a drain of the transistor 12 and one of a source and a drain of the transistor 15; a gate of the transistor 11 is electrically connected to the wiring VB1_UN; and the other of the source and the drain of the transistor 12 and a gate of the transistor 12 are electrically connected to the wiring VBP_IN.

One of a source and a drain of the transistor 13 is electrically connected to the wiring VBM_IN; the other of the source and the drain of the transistor 13 is electrically connected to one of a source and a drain of the transistor 14 and an inverting input terminal (denoted by "-" in FIG. 1A) of the comparator 50; a gate of the transistor 13 is electrically connected to the wiring VB2_IN; and the other of the source and the drain of the transistor 14 and a gate of the transistor 14 are electrically connected to the wiring VBP_IN.

The other of the source and the drain of the transistor 15 is electrically connected to one terminal of the capacitor C11 and a non-inverting input terminal (denoted by "+" in FIG. 1A) of the comparator 50; a gate of the transistor 15 is electrically connected to the wiring SH_IN; the other terminal of the capacitor C11 is electrically connected to the wiring VBM_IN; and an output terminal of the comparator 50 is electrically connected to the output terminal S_OUT.

Note that the other terminal of the capacitor C11 may be electrically connected to a wiring other than the wiring VBM_IN as long as it is supplied with a predetermined potential.

Here, a connection portion where the other of the source and the drain of the transistor 11, the one of the source and the drain of the transistor 12, and the one of the source and the drain of the transistor 15 are electrically connected to each other is referred to as a node N11; a connection portion where the other of the source and the drain of the transistor 13, the one of the source and the drain of the transistor 14, and the inverting input terminal of the comparator 50 are electrically connected to each other is referred to as a node N12; and a connection portion where the other of the source and the drain of the transistor 15, the one terminal of the capacitor C11, and the non-inverting input terminal of the comparator 50 are electrically connected to each other is referred to as a node N13.

The transistor 11 and the transistor 12 form a first source follower, and the transistor 13 and the transistor 14 form a second source follower. That is, the gate of the transistor 11 corresponds to an input of the first source follower, and the first source follower outputs a potential to the node N11. The gate of the transistor 13 corresponds to an input of the second source follower, and the second source follower outputs a potential to the node N12.

Configuration Example of Comparator

Next, a configuration example of the comparator 50 will be described. The comparator 50 includes the non-inverting input terminal, the inverting input terminal, and the output terminal. The comparator 50 has a function of amplifying a difference between potentials input to the non-inverting input terminal and the inverting input terminal. In the case where a potential input to the non-inverting input terminal is higher than a potential input to the inverting input terminal, the comparator 50 amplifies the potential difference in the high power supply potential direction and outputs the resulting potential. In the case where a potential input to the non-inverting input terminal is lower than a potential input to the inverting input terminal, the comparator 50 amplifies the potential difference in the low power supply potential direction and outputs the resulting potential.

Figure 1B:
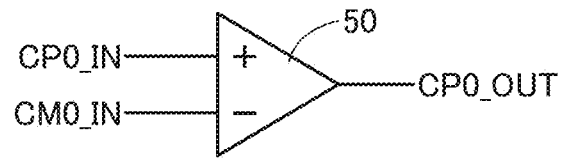
FIG. 1B is a diagram illustrating a symbol of a comparator.

FIG. 1B illustrates a symbol of the comparator 50. Here, as illustrated in FIG. 1B, the non-inverting input terminal of the comparator 50 is referred to as an input terminal CP0_IN, the inverting input terminal thereof is referred to as an input terminal CM0_IN, and the output terminal thereof is referred to as an output terminal CP0_OUT.

Figure 1C:
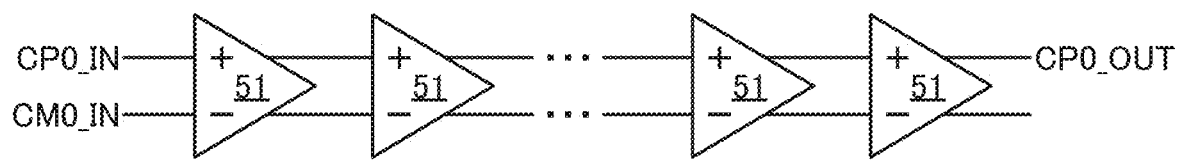
FIG. 1C is a diagram illustrating a configuration example of the comparator.

The comparator 50 includes one amplifier 51 or a plurality of amplifiers 51 connected in series. FIG. 1C illustrates a configuration example in which the comparator 50 includes a plurality of amplifiers 51.

Figure 2A:
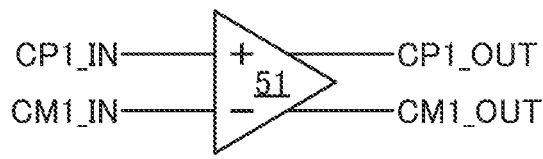
FIG. 2A is a diagram illustrating a symbol of an amplifier.

The amplifier 51 includes a non-inverting input terminal, an inverting input terminal, a non-inverting output terminal, and an inverting output terminal. FIG. 2A illustrates a symbol of the amplifier 51. Here, as illustrated in FIG. 2A, the non-inverting input terminal of the amplifier 51 is referred to as an input terminal CP1_IN, the inverting input terminal thereof is referred to as an input terminal CM1_IN, the non-inverting output terminal thereof is referred to as an output terminal CP1_OUT, and the inverting output terminal thereof is referred to as an output terminal CM1_OUT.

In FIG. 1C, the input terminal CP0_IN is electrically connected to the input terminal CP1_IN (see FIG. 2A) of a first amplifier 51, the input terminal CM0_IN is electrically connected to the input terminal CM1_IN of the first amplifier 51, the output terminal CP1_OUT of the first amplifier 51 is electrically connected to the input terminal CP1_IN of a second amplifier 51, and the output terminal CM1_OUT of the first amplifier 51 is electrically connected to the input terminal CM1_IN of the second amplifier 51.

Among the plurality of amplifiers 51, the output terminal CP1_OUT of the last amplifier 51 is electrically connected to the output terminal CP0_OUT. The number of amplifiers 51 can be determined by comparison of the amplification factor required for the comparator 50 with the amplification factor of one amplifier 51.

Figure 2B:
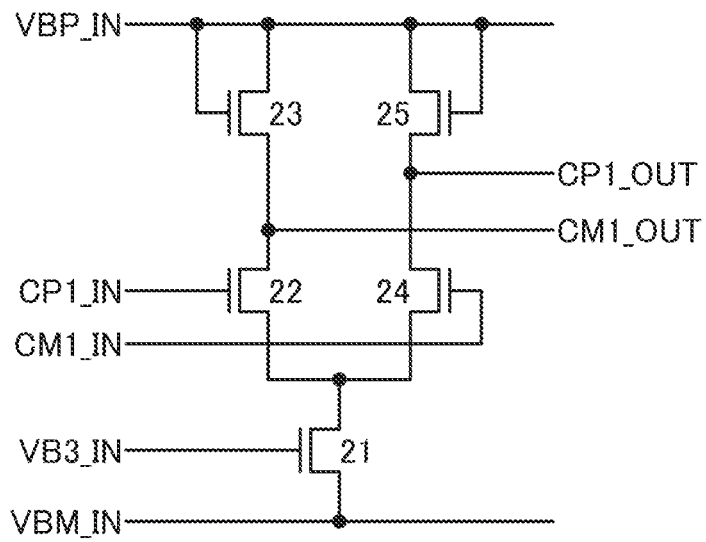
FIG. 2B and FIG. 2C are circuit diagrams illustrating configuration examples of the amplifier.

FIG. 2B is a circuit diagram illustrating an example in which the amplifier 51 is formed using n-channel transistors. The amplifier 51 includes a transistor 21 to a transistor 25. The transistor 21 to the transistor 25 are n-channel transistors.

The amplifier 51 also includes the wiring VBM_IN supplied with the negative electrode potential VBM of the secondary battery, the wiring VBP_IN supplied with the positive electrode potential VBP of the secondary battery, a wiring VB3_IN supplied with a predetermined potential VB3, the input terminal CP1_IN, the input terminal CM1_IN, the output terminal CP1_OUT, and the output terminal CM1_OUT.

Here, the predetermined potential VB3 is higher than the negative electrode potential VBM, and in the amplifier 51, the positive electrode potential VBP is a high power supply potential and the negative electrode potential VBM is a low power supply potential.

In the amplifier 51, one of a source and a drain of the transistor 21 is electrically connected to the wiring VBM_IN; the other of the source and the drain of the transistor 21 is electrically connected to one of a source and a drain of the transistor 22 and one of a source and a drain of the transistor 24; and a gate of the transistor 21 is electrically connected to the wiring VB3_IN.

The other of the source and the drain of the transistor 22 is electrically connected to one of a source and a drain of the transistor 23 and the output terminal CM1_OUT; the other of the source and the drain of the transistor 23 and a gate of the transistor 23 are electrically connected to the wiring VBP_IN; and a gate of the transistor 22 is electrically connected to the input terminal CP1_IN.

The other of the source and the drain of the transistor 24 is electrically connected to one of a source and a drain of the transistor 25 and the output terminal CP1_OUT; the other of the source and the drain of the transistor 25 and a gate of the transistor 25 are electrically connected to the wiring VBP_IN; and a gate of the transistor 24 is electrically connected to the input terminal CM1_IN.

Figure 2C:
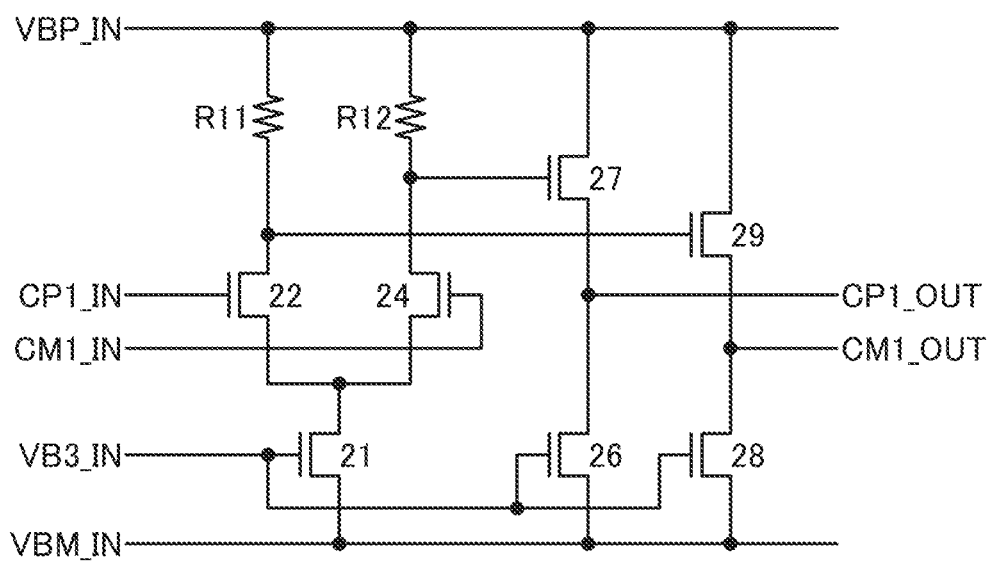

Alternatively, the amplifier 51 may be configured to include n-channel transistors and resistors. FIG. 2C is a circuit diagram illustrating a configuration example of the amplifier 51 different from that in FIG. 2B.

The amplifier 51 illustrated in FIG. 2C includes a resistor R11, a resistor R12, the transistor 21, the transistor 22, the transistor 24, and a transistor 26 to a transistor 29. The transistor 21, the transistor 22, the transistor 24, and the transistor 26 to the transistor 29 are re-channel transistors.

In the amplifier 51 illustrated in FIG. 2C, one of the source and the drain of the transistor 21 is electrically connected to the wiring VBM_IN; the other of the source and the drain of the transistor 21 is electrically connected to one of the source and the drain of the transistor 22 and one of the source and the drain of the transistor 24; and the gate of the transistor 21 is electrically connected to the wiring VB3_IN, a gate of the transistor 26, and a gate of the transistor 28.

The other of the source and the drain of the transistor 22 is electrically connected to one terminal of the resistor R11 and a gate of the transistor 29; the other terminal of the resistor R11 is electrically connected to the wiring VBP_IN; and the gate of the transistor 22 is electrically connected to the input terminal CP1_IN.

The other of the source and the drain of the transistor 24 is electrically connected to one terminal of the resistor R12 and a gate of the transistor 27; the other terminal of the resistor R12 is electrically connected to the wiring VBP_IN; and the gate of the transistor 24 is electrically connected to the input terminal CM1_IN.

One of a source and a drain of the transistor 26 is electrically connected to the wiring VBM_IN; the other of the source and the drain of the transistor 26 is electrically connected to one of a source and a drain of the transistor 27 and the output terminal CP1_OUT; and the other of the source and the drain of the transistor 27 is electrically connected to the wiring VBP_IN.

One of a source and a drain of the transistor 28 is electrically connected to the wiring VBM_IN; the other of the source and the drain of the transistor 28 is electrically connected to one of a source and a drain of the transistor 29 and the output terminal CM1_OUT; and the other of the source and the drain of the transistor 29 is electrically connected to the wiring VBP_IN.

Operation Example of Semiconductor Device

FIG. 3A to FIG. 3E are timing charts showing potential changes in the secondary battery and the semiconductor device during charging of the secondary battery.

In each of FIG. 3A to FIG. 3E, the vertical axis represents potential, and the horizontal axis represents time. Note that the horizontal axis is common to FIG. 3A to FIG. 3E (i.e., the same position represents the same time). In addition, the potential of the same wiring, the same terminal, or the same node is sometimes shown in a plurality of charts for reference.

In FIG. 3A to FIG. 3E, potential changes in the secondary battery and the semiconductor device during charging of the secondary battery are shown in separate periods D11 to D13. In the period D11, charging of the secondary battery starts, and the potential of the wiring, the terminal, or the node is set to a predetermined potential. Moreover, a potential between the positive electrode and the negative electrode of the secondary battery (to be precise, a potential related to the potential between the positive electrode and the negative electrode) is sampled at predetermined intervals. A micro-short circuit occurs in the period D12, and the period D13 is a charge period after the micro-short circuit.

Note that although the secondary battery is assumed to be a secondary battery in which a potential between the positive electrode and the negative electrode is changed by charge and discharge, the following description is also applicable to a secondary battery in which a potential between the positive electrode and the negative electrode is not changed by charge and discharge (or the amount of change is small). Examples of the secondary battery in which a potential between the positive electrode and the negative electrode is changed by charge and discharge include a lithium-ion battery, and a specific example is a lithium-ion battery that is being subjected to constant current charging.

Figure 3A:
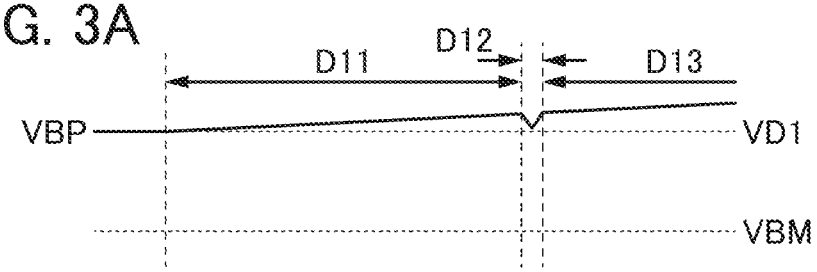
FIG. 3A, FIG. 3B, FIG. 3C, FIG. 3D, and FIG. 3E are timing charts showing a potential change in a secondary battery and a semiconductor device.

FIG. 3A shows a state where the positive electrode potential VBP of the secondary battery increases from an initial potential VD1 when charging is started in the period D11. Thus, the positive electrode potential VBP in relation to the negative electrode potential VBM (the potential between the positive electrode and the negative electrode) of the secondary battery increases. In the period D12, a micro-short circuit occurs, and the positive electrode potential VBP decreases instantaneously. When the micro-short circuit ends, the positive electrode potential VBP increases as in the period D11.

Figure 3B:
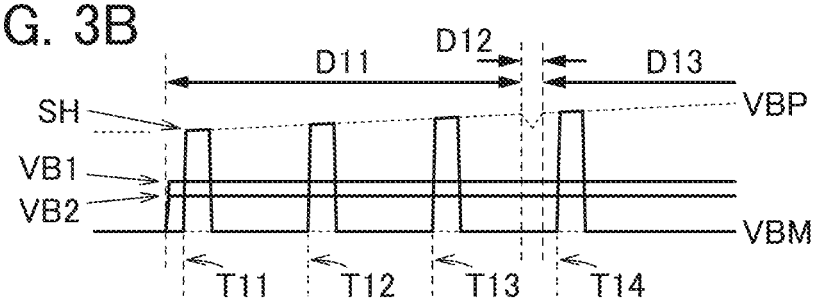

FIG. 3B shows states of the predetermined potential VB1, the predetermined potential VB2, and the sampling signal SH. When charging is started in the period D11, the potential VB1 and the potential VB2 are applied, and the sampling signal SH becomes high level at predetermined intervals. Here, the high level of the sampling signal SH is represented by the positive electrode potential VBP, and the low level of the sampling signal SH is represented by the negative electrode potential VBM. The sampling signal SH becomes high level at Time T11 to Time T14.

Figure 3C:
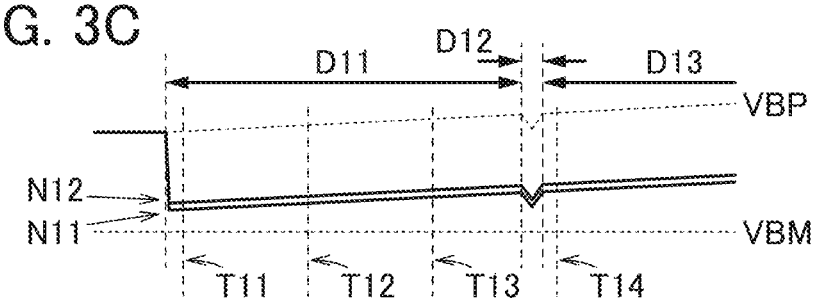

FIG. 3C shows states of the node N11 and the node N12. When the potential VB1 and the potential VB2 are applied in the period D11, the potentials of the node N11 and the node N12 are determined. Since the potential VB1 is higher than the potential VB2, the potential of the node N11 is lower than the potential of the node N12, and the potentials of the node N11 and the node N12 increase along with an increase in the positive electrode potential VBP. When a micro-short circuit occurs in the period D12 and the positive electrode potential VBP decreases instantaneously, the potentials of the node N11 and the node N12 also decrease instantaneously.

Figure 3D:
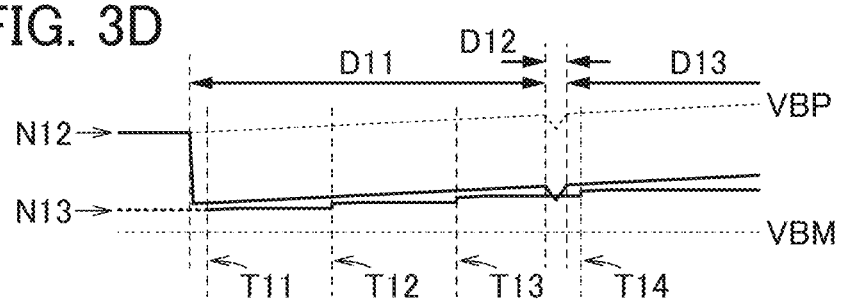

FIG. 3D shows states of the node N12 and the node N13. When the sampling signal SH becomes high level, the potential of the node N13 is set to the potential of the node N11 at that time. Thus, the potential of the node N13 is lower than the potential of the node N12 and increases in a step-like manner. When the sampling signal SH is at low level, the potential of the node N13 is not affected by the potential of the node N11. Consequently, the potential of the node N13 does not change when a micro-short circuit occurs in the period D12 and the positive electrode potential VBP decreases instantaneously. As a result, in the period D12, the potential of the node N13 becomes higher than the potential of the node N12.

Figure 3E:
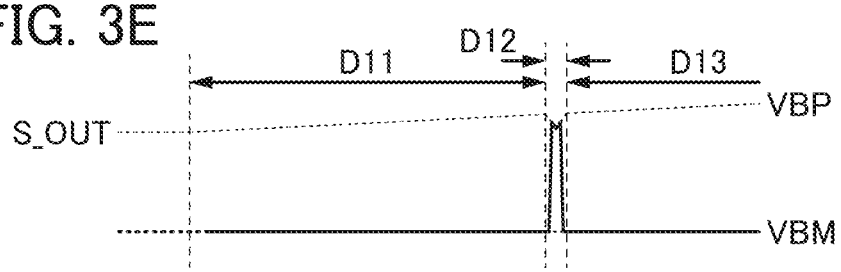

FIG. 3E shows a state of the output terminal S_OUT. In the period D11 and the period D13, the potential of the output terminal S_OUT is the negative electrode potential VBM (low level) because the potential of the node N13 is lower than the potential of the node N12. In the period D12, the potential of the output terminal S_OUT becomes the positive electrode potential VBP (high level) because the potential of the node N13 becomes higher than the potential of the node N12.

In other words, the semiconductor device 100 outputs the negative electrode potential VBM from the output terminal S_OUT in the period D11 and the period D13 in each of which no micro-short circuit occurs, and outputs the positive electrode potential VBP from the output terminal S_OUT when a micro-short circuit occurs. By sampling a potential of the node N11 that is before a micro-short circuit occurs and is related to the potential between the positive electrode and the negative electrode of the secondary battery, the semiconductor device 100 can detect a micro-short circuit of the secondary battery even when the potential between the positive electrode and the negative electrode is slightly decreased. The semiconductor device 100 has a function of an abnormality detection device for detecting a micro-short circuit of a secondary battery.

<Transistor Included in Semiconductor Device>

As each of the transistor 11 to the transistor 15 included in the semiconductor device 100 and the transistors included in the comparator 50, a transistor including a metal oxide in a channel formation region (OS transistor) can be used.

For example, an OS transistor has the following features: it has an extremely low off-state current, high voltage can be applied between a source and a drain, and it can be stacked because it is a thin film transistor. Here, off-state current refers to drain current of a transistor in an off state. An oxide semiconductor has a bandgap of 2.5 eV or higher, preferably 3.0 eV or higher; thus, an OS transistor has features of low leakage current due to thermal excitation and extremely low off-state current. The off-state current per micrometer of channel width of an OS transistor can be, for example, lower than or equal to 100 zA/μm, lower than or equal to 10 zA/μm, lower than or equal to 1 zA/μm, or lower than or equal to 10 yA/μm.

An OS transistor is particularly suitable for the transistor 15 because of its feature of extremely low off-state current. When the off-state current of the transistor 15 is low, a leakage current from the capacitor C11 can be kept low, and the potential of the node N13 can be retained accurately. That is, even when a change in potential between the positive electrode and the negative electrode of the secondary battery due to a micro-short circuit is small, the semiconductor device 100 can detect the micro-short circuit accurately.

Alternatively, when the off-state current of the transistor 15 is low, a leakage current from the capacitor C11 can be kept low, and the potential of the node N13 can be retained for a long time. That is, the interval between samplings of the potential between the positive electrode and the negative electrode of the secondary battery can be increased, and the semiconductor device 100 can be a semiconductor device that has low power consumption and is less likely to be affected by noise and the like. For example, it is possible to decrease the possibility that the timing when the semiconductor device 100 samples the potential between the positive electrode and the negative electrode is synchronized with the occurrence of a micro-short circuit.

Furthermore, an OS transistor has the following features: the off-state current is less likely to increase even in a high-temperature environment, and the ratio of on-state current to off-state current is high even in a high-temperature environment. The semiconductor device 100 is formed using an OS transistor, whereby the reliability of the semiconductor device 100 can be increased.

A metal oxide used in a channel formation region of an OS transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture and hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 2 and Embodiment 3.

Moreover, an OS transistor is a thin film transistor and thus can be stacked to be provided. For example, an OS transistor can be provided over a circuit formed using a Si transistor formed on a single crystal silicon substrate. Consequently, the chip area of the semiconductor device 100 can be reduced.

Alternatively, as the transistor 11 to the transistor 15 included in the semiconductor device 100 and the transistors included in the comparator 50, a transistor other than an OS transistor may be used. For example, a transistor including a semiconductor with a wide bandgap in a channel formation region may be used. The semiconductor with a wide bandgap sometimes refers to a semiconductor whose bandgap is higher than or equal to 2.2 eV, and examples thereof include silicon carbide, gallium nitride, and diamond.

<Features of Semiconductor Device>

As described above, the semiconductor device 100 is capable of detecting a small spontaneous potential change due to a micro-short circuit by sampling a potential related to the potential between the positive electrode and the negative electrode of the secondary battery and comparing the sampled potential with a potential related to a post-sampling potential between the positive electrode and the negative electrode. In other words, the semiconductor device 100 can deal with a potential change in the secondary battery during charge and the like.

Using a transistor with a low off-state current, such as an OS transistor, as the transistor that performs sampling, a sampled potential can be retained accurately, and even a small potential change can be detected. Moreover, the interval between samplings can be increased.

A sampled potential is lowered with the use of the first source follower and the second source follower, whereby the semiconductor device 100 can be operated using the potential between the positive electrode and the negative electrode of the secondary battery. A potential other than the negative electrode potential and the positive electrode potential of the secondary battery does not need to be provided as a power supply potential, so that power consumption of the semiconductor device 100 can be reduced.

Note that this embodiment can be implemented in combination with the other embodiments described in this specification as appropriate.

Embodiment 2

In this embodiment, an example of a structure of an OS transistor that can be used in the semiconductor device 100 described in the above embodiment will be described. Since an OS transistor is a thin film transistor and can be provided to be stacked, a structure example of a semiconductor device in which an OS transistor is provided above a Si transistor formed in a single crystal silicon substrate will be described in this embodiment.

Structure Example of Semiconductor Device

Figure 4:
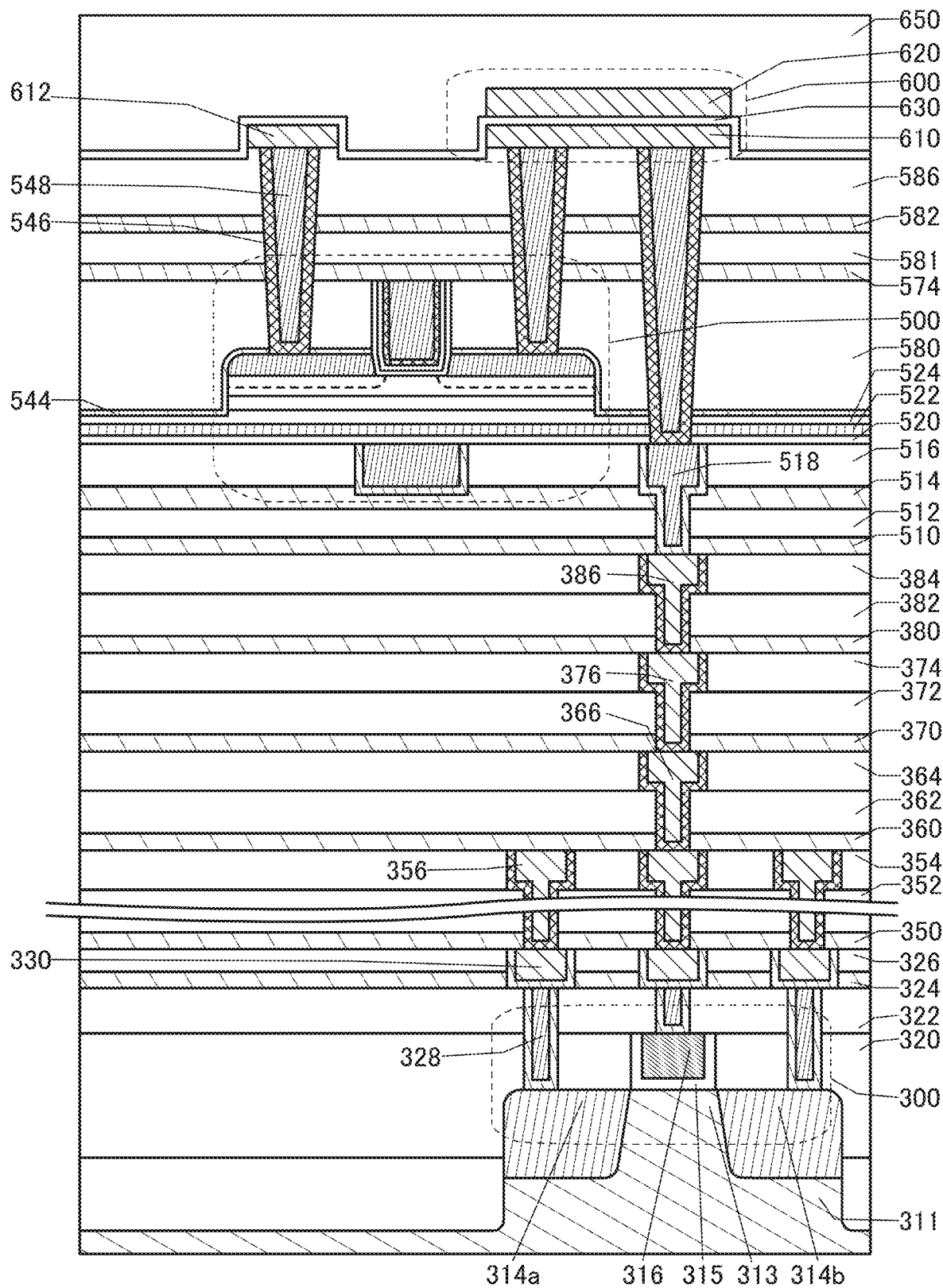
FIG. 4 is a cross-sectional view illustrating a structure example of a semiconductor device.
Figure 5A:
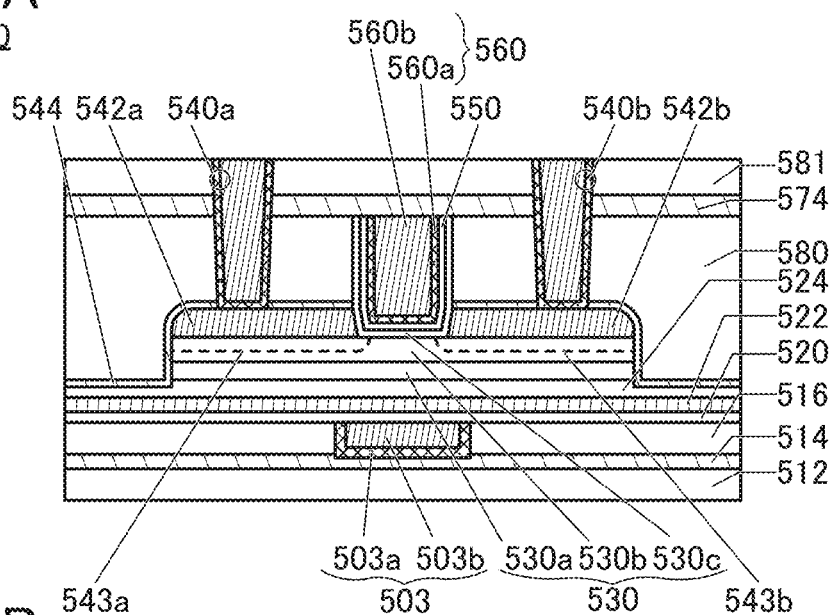
FIG. 5A, FIG. 5B, and FIG. 5C are cross-sectional views illustrating structure examples of transistors.
Figure 5B:
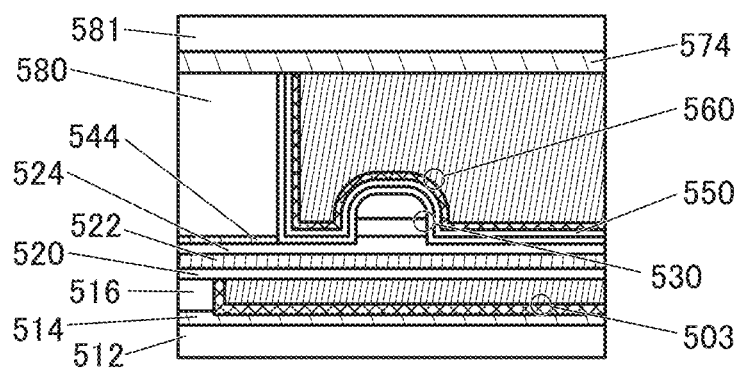
Figure 5C:
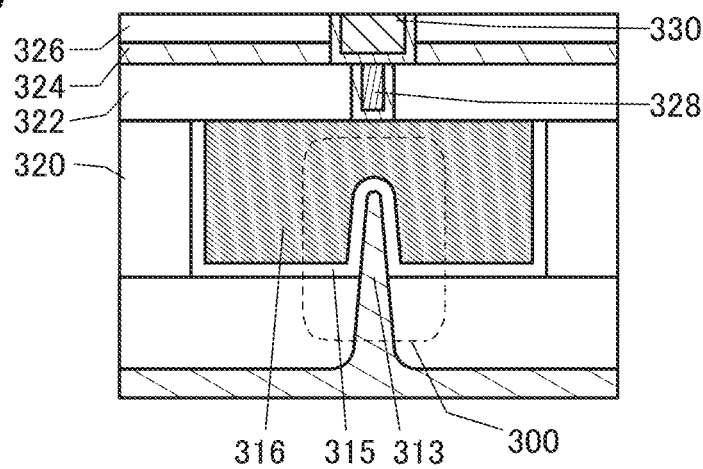

A semiconductor device illustrated in FIG. 4 includes a transistor 300, a transistor 500, and a capacitor 600. FIG. 5A is a cross-sectional view of the transistor 500 in the channel length direction, FIG. 5B is a cross-sectional view of the transistor 500 in the channel width direction, and FIG. 5C is a cross-sectional view of the transistor 300 in the channel width direction.

The transistor 500 is a transistor including a metal oxide in its channel formation region (OS transistor). Since the transistor 500 has a feature of extremely low off-state current, the use of the transistor 500 in the semiconductor device 100 in the above embodiment enables the semiconductor device 100 to detect a micro-short circuit even when a change in potential between the positive electrode and the negative electrode of a secondary battery due to a micro-short circuit is small.

The semiconductor device described in this embodiment includes the transistor 300, the transistor 500, and the capacitor 600 as illustrated in FIG. 4. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 5C, in the transistor 300, a top surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 4 is just an example and is not limited to having the structure shown therein; an appropriate transistor can be used in accordance with the circuit configuration or the driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for eliminating a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen and impurities from the substrate 311, the transistor 300, or the like into the region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for the interlayer film, parasitic capacitance generated between wirings can be reduced A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 4, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 4, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 4, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 4, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen and impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that prevents the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for the interlayer film, parasitic capacitance generated between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, diffusion of hydrogen from the transistor 300 into the transistor 500 can be inhibited.

The transistor 500 is provided above the insulator 516.

As illustrated in FIG. 5A and FIG. 5B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 5A and FIG. 5B, an insulator 544 is preferably positioned between the insulator 580 and the oxide 530a, the oxide 530b, the conductor 542a, and the conductor 542b. As illustrated in FIG. 5A and FIG. 5B, the conductor 560 preferably includes a conductor 560a provided on the inner side of the insulator 550 and a conductor 560b provided to be embedded on the inner side of the conductor 560a. Moreover, as illustrated in FIG. 5A and FIG. 5B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. The transistor 500 illustrated in FIG. 4, FIG. 5A, and FIG. 5B is just an example and is not limited to having the structure shown therein; an appropriate transistor can be used in accordance with the circuit configuration or the driving method.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Consequently, miniaturization and high integration of the semiconductor device can be achieved.

In addition, since the conductor 560 is formed in the region between the conductor 542*a* and the conductor 542*b* in a self-aligned manner, the conductor 560 does not have a region overlapping the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, Vth of the transistor 500 can be controlled by changing a potential applied to the conductor 503 independently of a potential applied to the conductor 560. In particular, when a negative potential is applied to the conductor 503, Vth of the transistor 500 can be higher than 0 V, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature in that the side surface and the vicinity of the oxide 530 in contact with the conductor 542*a* and the conductor 542*b* functioning as the source electrode and the drain electrode are of i-type like the channel formation region. The side surface and the vicinity of the oxide 530 in contact with the conductor 542*a* and the conductor 542*b* are in contact with the insulator 544 and thus can be of i-type like the channel formation region. Note that in this specification and the like, "i-type" can be equated with "highly purified intrinsic" to be described later. The S-channel structure disclosed in this specification and the like is different from a Fin-type structure and a planar structure. With the S-channel structure, a transistor having improved resistance to a short-channel effect, that is, a transistor in which a short-channel effect is less likely to occur can be provided.

The conductor 503 has a structure similar to that of the conductor 518; a conductor 503*a* is formed in contact with an inner wall of an opening in the insulator 514 and the insulator 516, and a conductor 503*b* is formed on the inner side.

The insulator 520, the insulator 522, the insulator 524, and the insulator 550 have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^{-3}$, preferably greater than or equal to $1.0\times10^{19}$ atoms/cm$^{-3}$, further preferably greater than or equal to $2.0\times10^{19}$ atoms/cm$^{-3}$ or greater than or equal to $3.0\times10^{20}$ atoms/cm$^{-3}$ in TDS (Thermal Desorption Spectroscopy) analysis. Note that the temperature of the film surface in the TDS analysis is preferably within the range of 100° C. to 700° C., or 100° C. to 400° C.

When the insulator 524 includes an excess-oxygen region, it is preferable that the insulator 522 have a function of inhibiting diffusion of oxygen (e.g., oxygen atoms and oxygen molecules) (or that the insulator 522 be less likely to transmit the above oxygen).

When the insulator 522 has a function of inhibiting diffusion of oxygen and impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing what is called a high-k material, such as aluminum oxide, hafnium oxide, tantalum oxide, zirconium oxide, lead zirconate titanate (PZT), strontium titanate (SrTiO$_3$), or (Ba, Sr)TiO$_3$ (BST). With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In some cases, bonding of part of hydrogen to oxygen bonded to a metal atom generates electrons serving as carriers. Thus, a transistor using a metal oxide containing a large amount of hydrogen is likely to have normally-on characteristics.

A defect in which hydrogen has entered an oxygen vacancy can function as a donor of a metal oxide. However, it is difficult to evaluate the defects quantitatively. Thus, the metal oxide is sometimes evaluated by not its donor concentration but its carrier concentration. Therefore, in this specification and the like, as the parameter of the metal oxide, the carrier concentration assuming the state where an electric field is not applied is sometimes used instead of the donor concentration. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^{-3}$, preferably lower than $1 \times 10^{19}$ atoms/cm$^{-3}$, further preferably lower than $5 \times 10^{18}$ atoms/cm$^{-3}$, still further preferably lower than $1 \times 10^{18}$ atoms/cm$^{-3}$. When a metal oxide in which impurities such as hydrogen are sufficiently reduced is used for a channel formation region of a transistor, the transistor can have stable electrical characteristics.

When a metal oxide is used for the oxide 530, the carrier concentration of the metal oxide in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 542 and the oxide 530b, but the layer may be formed between the conductor 542 and the oxide 530c, or formed between the conductor 542 and the oxide 530b and between the conductor 542 and the oxide 530c.

The metal oxide functioning as the channel formation region in the oxide 530 has a bandgap of preferably 2 eV or higher, further preferably 2.5 eV or higher. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers having different atomic ratios of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 5A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. Furthermore, the channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier concentration of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0 \times 10^{18}$ atoms/cm$^{-3}$, preferably greater than or equal to $1.0 \times 10^{19}$ atoms/cm$^{-3}$, further preferably greater than or equal to $2.0 \times 10^{19}$ atoms/cm$^{-3}$ or greater than or equal to $3.0 \times 10^{20}$ atoms/cm$^{-3}$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits oxygen diffusion inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode has a two-layer structure in FIG. 5A and FIG. 5B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

The conductor 560b also functions as a wiring and thus is preferably a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably lowered.

The opening of the insulator 580 is formed to overlap the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for the interlayer film, parasitic capacitance between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 are shown to have a single-layer structure in FIG. 4, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided. Alternatively, a semiconductor device using a transistor including an oxide semiconductor can be miniaturized or highly integrated.

Transistor Structure Examples

Note that the structure of the transistor 500 in the semiconductor device described in this embodiment is not limited to the above. Examples of structures that can be used for the transistor 500 will be described below.

Transistor Structure Example 1

Figure 6A:
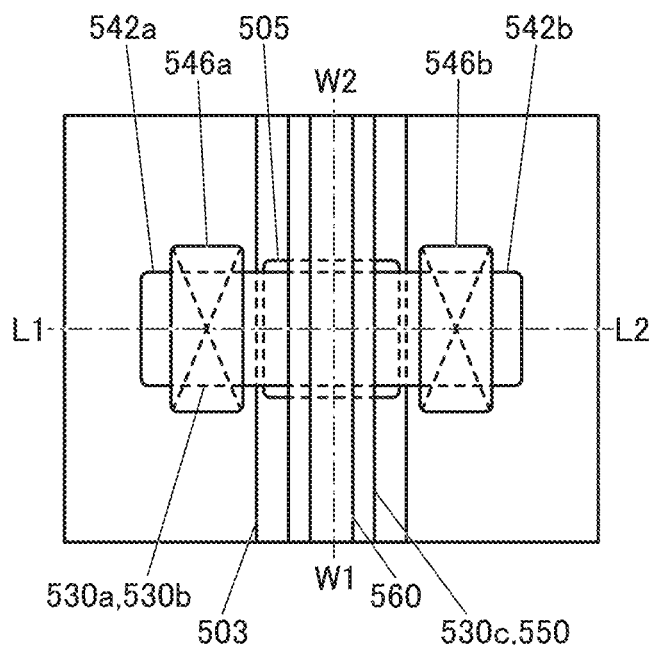
FIG. 6A is a top view illustrating a structure example of a transistor.
Figure 6C:
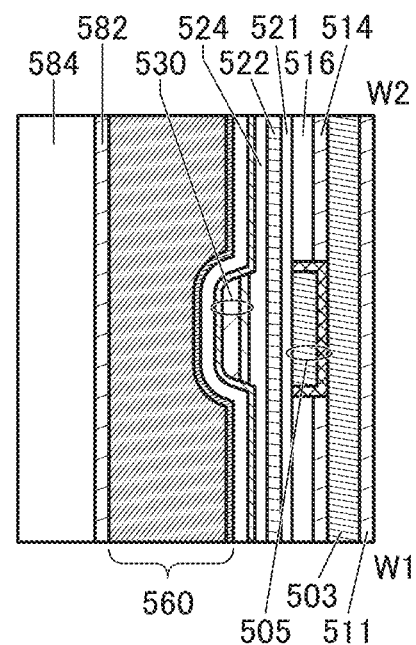
FIG. 6B and FIG. 6C are cross-sectional views illustrating the structure example of the transistor.
Figure 6B:
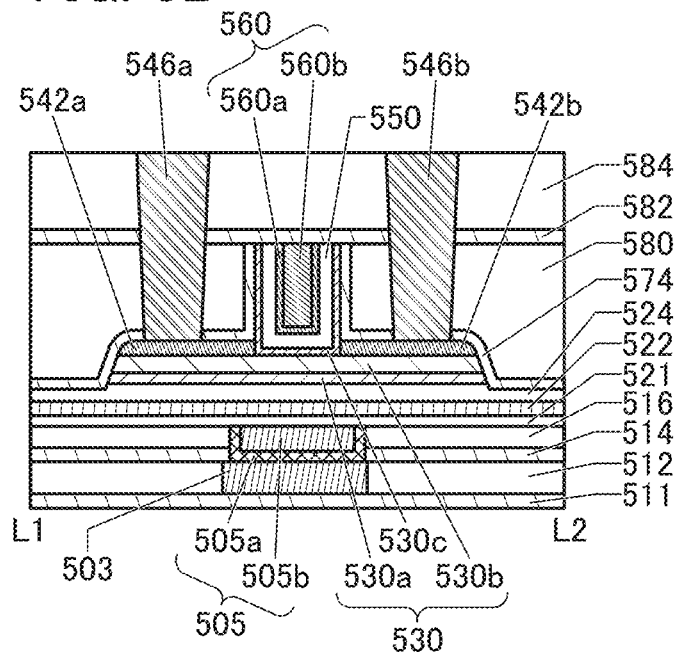

A structure example of a transistor 510A is described with reference to FIG. 6A, FIG. 6B, and FIG. 6C. FIG. 6A is a top view of the transistor 510A. FIG. 6B is a cross-sectional view of a portion indicated by the dashed-dotted line L1-L2 in FIG. 6A. FIG. 6C is a cross-sectional view of a portion indicated by the dashed-dotted line W1-W2 in FIG. 6A. Note that for clarification of the drawing, some components are not illustrated in the top view of FIG. 6A.

FIG. 6A, FIG. 6B, and FIG. 6C illustrate the transistor 510A and the insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 6, the oxide 530c, the insulator 550, and the conductor 560 are positioned in an opening portion provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of an oxygen atom, an oxygen molecule, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for the interlayer film, parasitic capacitance generated between wirings can be reduced.

The conductor 503 is formed to be embedded in the insulator 512. Here, the level of the top surface of the conductor 503 and the level of the top surface of the insulator 512 can be substantially the same. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 overlap each other, in the case where a potential is applied to the conductor 560 and the conductor 505, an electric field generated from the conductor 560 and an electric field generated from the conductor 505 are connected and can cover a channel formation region formed in the oxide 530.

That is, the channel formation region can be electrically surrounded by the electric field of the conductor 560 having a function of the first gate electrode and the electric field of the conductor 505 having a function of the second gate electrode. In other words, the transistor 510A has a surrounded channel (S-channel) structure, like the transistor 500 described above.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for the interlayer film, parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification and the like, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stacked-layer structure of any of the above conductive materials and titanium or titanium nitride.

The insulator 521, the insulator 522, and the insulator 524 function as a second gate insulating film.

The insulator 522 preferably has a barrier property. The insulator 522 having a barrier property functions as a layer that inhibits entry of impurities such as hydrogen into the transistor 510A from the surroundings of the transistor 510A.

For example, the insulator 522 is preferably formed using a single layer or stacked layers of an insulator containing what is called a high-k material, such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST). With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

Note that the second gate insulating film is shown to have a stacked-layer structure of three layers in FIG. 6, but may be two or less layers or have a stacked-layer structure of four or more layers. In such cases, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530*b* from the components formed below the oxide 530*a*. Moreover, including the oxide 530*c* over the oxide 530*b* makes it possible to inhibit diffusion of impurities into the oxide 530*b* from the components formed above the oxide 530*c*. As the oxide 530, the above-described oxide semiconductor, which is one type of metal oxide, can be used.

Note that the oxide 530*c* is preferably provided in the opening portion in the insulator 580 with the insulator 574 positioned therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542*a* and the conductor 542*b*, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and a high oxidation resistance.

Although FIG. 6 illustrates the case where the conductor 542 has a single-layer structure, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion in the insulator 580 with the oxide 530*c* and the insulator 574 positioned therebetween.

With miniaturization and high integration of transistors, a problem such as leakage current may arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high dielectric constant.

The conductor 560 functioning as the first gate electrode includes the conductor 560*a* and the conductor 560*b* over the conductor 560*a*. Like the conductor 505*a*, the conductor 560*a* is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting oxygen diffusion, the range of choices for the material of the conductor 560*b* can be expanded. That is, the conductor 560*a* inhibits oxidation of the conductor 560*b*, thereby preventing the decrease in conductivity.

As a conductive material having a function of inhibiting diffusion of oxygen, tantalum, tantalum nitride, ruthenium, or ruthenium oxide is preferably used, for example. For the conductor 560*a*, the oxide semiconductor that can be used as the oxide 530 can be used. In that case, when the conductor 560*b* is deposited by a sputtering method, the conductor 560*a* can have a reduced electric resistance to be a conductor. This can be referred to as an OC (Oxide Conductor) electrode.

The conductor 560 functions as a wiring and thus is preferably formed using a conductor having high conductivity. For example, a conductive material containing tungsten, copper, or aluminum as its main component can be used. The conductor 560*b* may have a stacked-layer structure, for example, a stacked-layer structure of titanium or titanium nitride and the above conductive material.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530*b* through the oxide 530*c* and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer film, parasitic capacitance generated between wirings can be reduced.

The transistor 510A may be electrically connected to another component through a plug or a wiring, such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, a semiconductor device including a transistor that contains an oxide semiconductor and has a high on-state current can be provided. Alternatively, a semiconductor device using a transistor that contains an oxide semiconductor and has a low off-state current can be provided. Alternatively, a semiconductor device that has small variations in electrical characteristics, stable electrical characteristics, and high reliability can be provided.

Transistor Structure Example 2

Figure 7A:
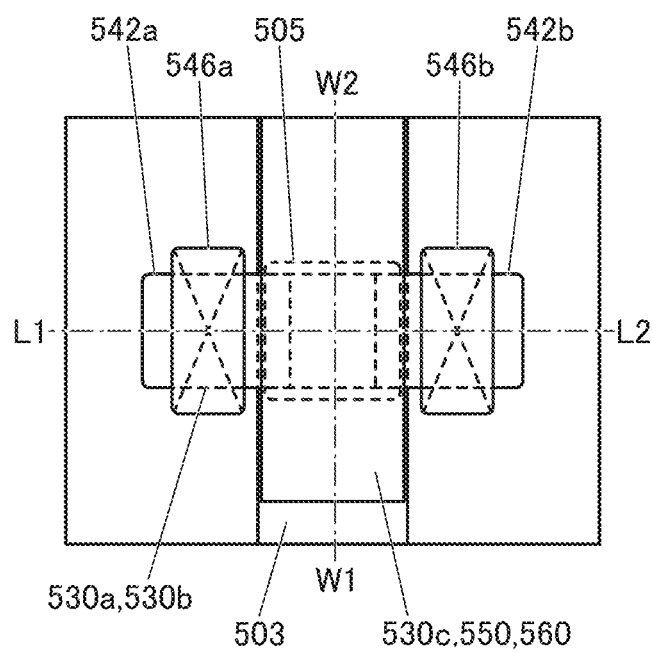
FIG. 7A is a top view illustrating a structure example of a transistor.
Figure 7C:
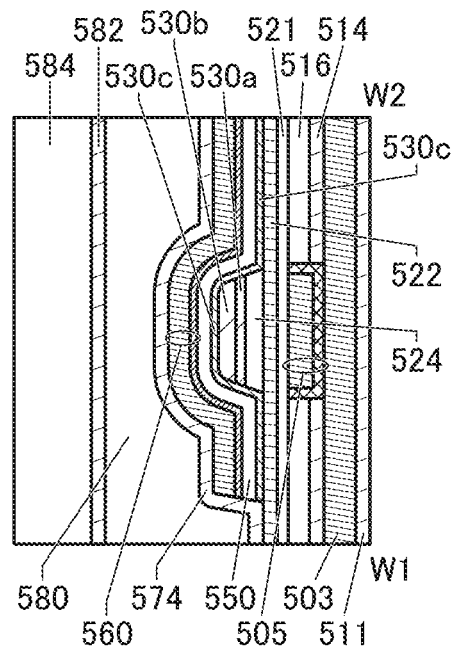
FIG. 7B and FIG. 7C are cross-sectional views illustrating the structure example of the transistor.
Figure 7B:
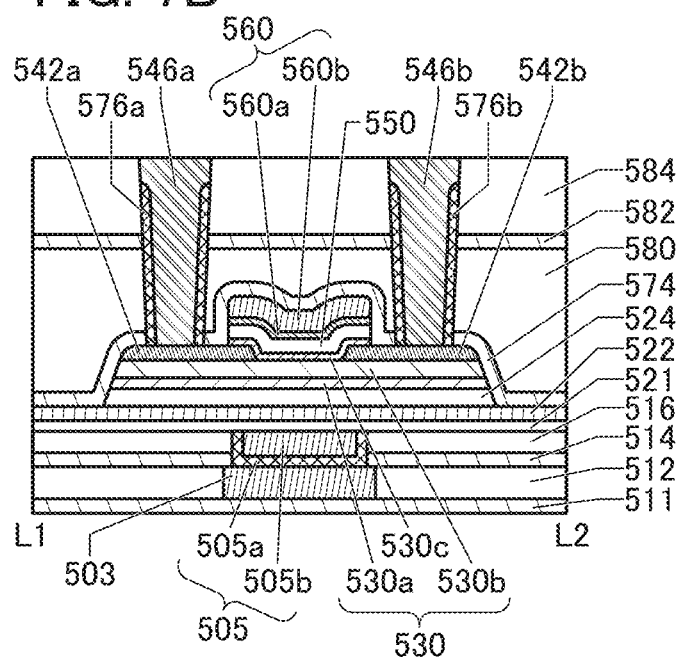

A structure example of a transistor 510B is described with reference to FIG. 7A, FIG. 7B, and FIG. 7C. FIG. 7A is a top view of the transistor 510B. FIG. 7B is a cross-sectional view of a portion indicated by the dashed-dotted line L1-L2 in FIG. 7A. FIG. 7C is a cross-sectional view of a portion indicated by the dashed-dotted line W1-W2 in FIG. 7A. Note that for clarification of the drawing, some components are not illustrated in the top view of FIG. 7A.

The transistor 510B is a variation example of the transistor 510A. Therefore, differences from the transistor 510A will be mainly described to avoid repeated description.

The transistor 510B includes a region where the oxide 530c, the insulator 550, and the conductor 560 overlap the conductor 542 (the conductor 542a and the conductor 542b). With this structure, a transistor having a high on-state current can be provided. Moreover, a transistor having high controllability can be provided.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and a side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

Transistor Structure Example 3

Figure 8A:
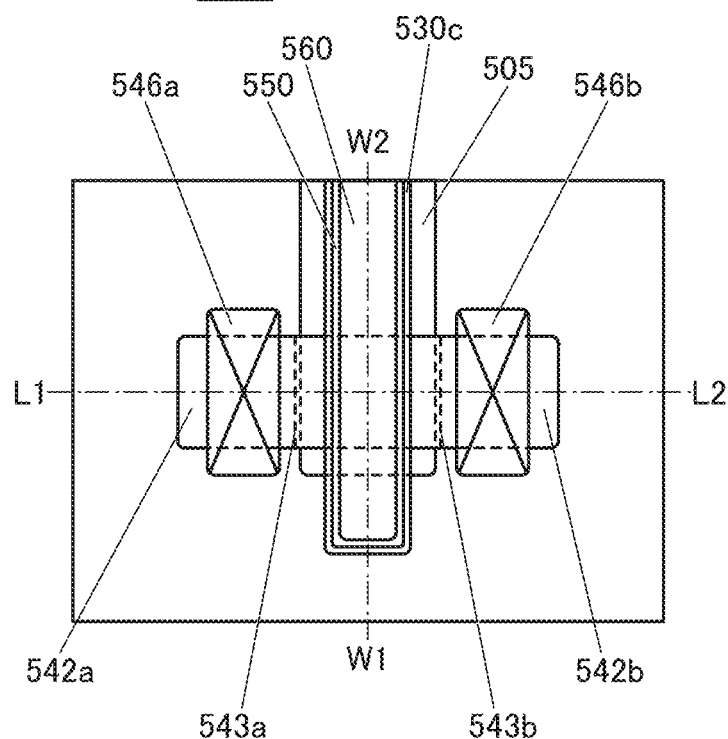
FIG. 8A is a top view illustrating a structure example of a transistor.
Figure 8C:
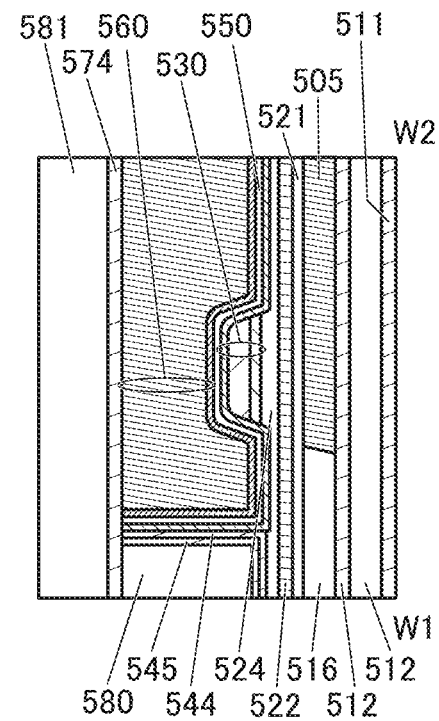
FIG. 8B and FIG. 8C are cross-sectional views illustrating the structure example of the transistor.
Figure 8B:
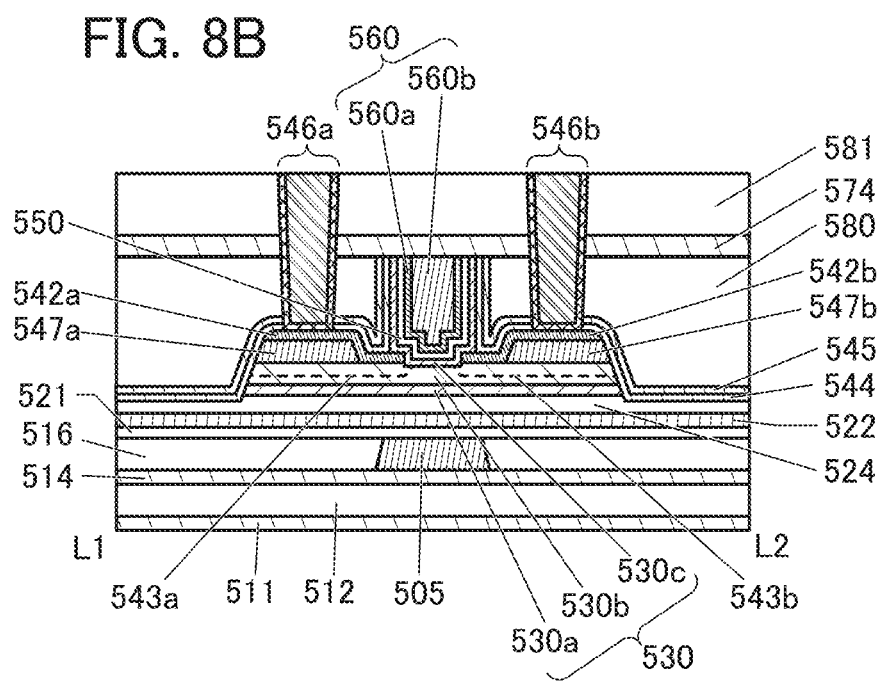

A structure example of a transistor 510C is described with reference to FIG. 8A, FIG. 8B, and FIG. 8C. FIG. 8A is a top view of the transistor 510C. FIG. 8B is a cross-sectional view of a portion along the dashed-dotted line L1-L2 in FIG. 8A. FIG. 8C is a cross-sectional view of a portion along the dashed-dotted line W1-W2 in FIG. 8A. Note that for clarity of the drawing, some components are not illustrated in the top view of FIG. 8A.

The transistor 510C is a variation example of the transistor 510A. Therefore, differences from the transistor 510A will be mainly described to avoid repeated description.

In the transistor 510C illustrated in FIG. 8, a conductor 547a is positioned between the conductor 542a and the oxide 530b, and a conductor 547b is positioned between the conductor 542b and the oxide 530b. Here, the conductor 542a (the conductor 542b) has a region that extends beyond the top surface of the conductor 547a (the conductor 547b) and its side surface on the conductor 560 side and is in contact with the top surface of the oxide 530b. For the conductors 547, a conductor that can be used for the conductor 542 is used. It is preferable that the thickness of the conductor 547 be at least greater than that of the conductor 542.

In the transistor 510C illustrated in FIG. 8, because of the above structure, the conductor 542 can be closer to the conductor 560 than in the transistor 510A. Alternatively, the conductor 560 can overlap an end portion of the conductor 542a and an end portion of the conductor 542b. Thus, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 8 may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 6, in the transistor 510C illustrated in FIG. 8, the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

Transistor Structure Example 4

Figure 9A:
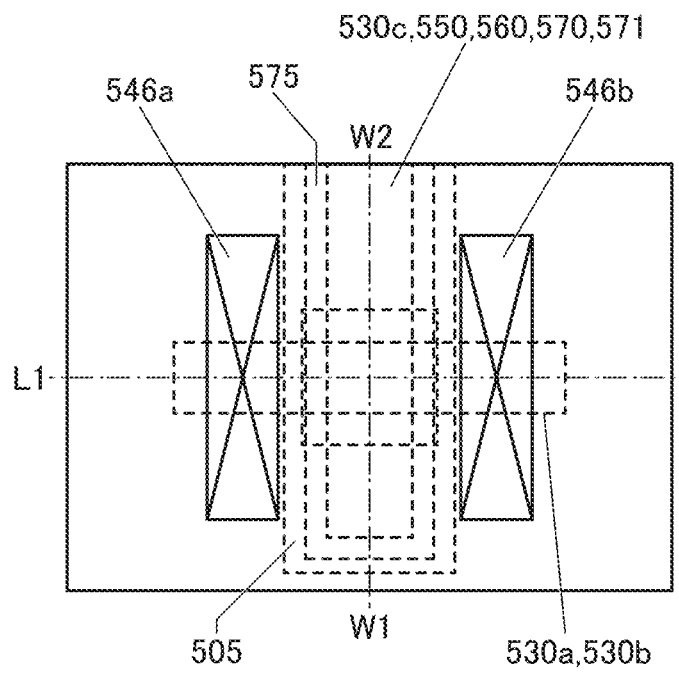
FIG. 9A is a top view illustrating a structure example of a transistor.
Figure 9C:
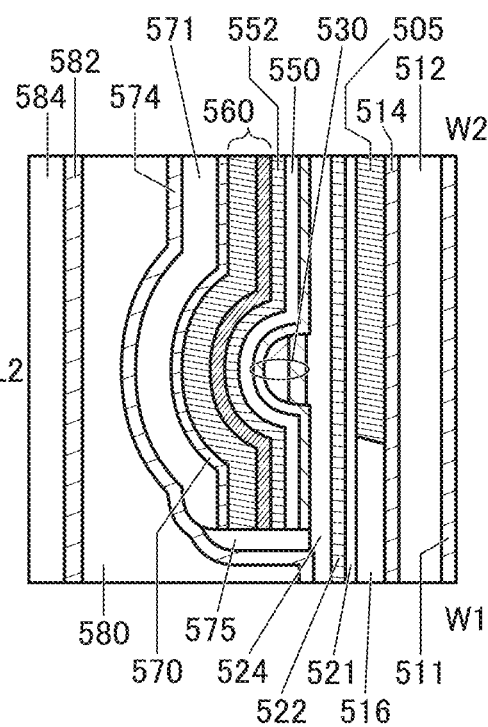
FIG. 9B and FIG. 9C are cross-sectional views illustrating the structure example of the transistor.
Figure 9B:
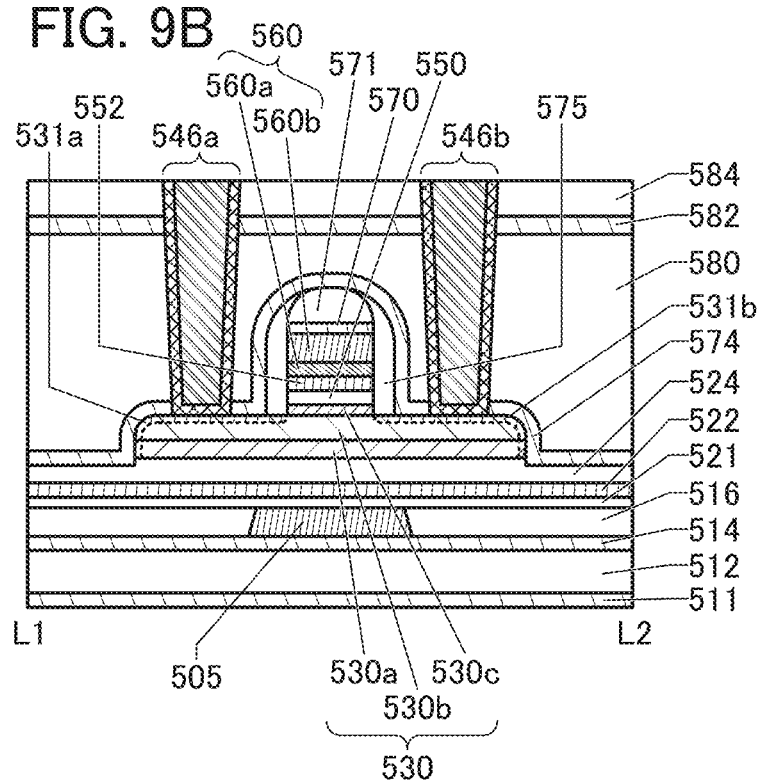

A structure example of a transistor 510D is described with reference to FIG. 9A, FIG. 9B, and FIG. 9C. FIG. 9A is a top view of the transistor 510D. FIG. 9B is a cross-sectional view of a portion along the dashed-dotted line L1-L2 in FIG. 9A. FIG. 9C is a cross-sectional view of a portion along the dashed-dotted line W1-W2 in FIG. 9A. Note that for simplification of the drawing, some components are not illustrated in the top view of FIG. 9A.

The transistor 510D is a variation example of the above transistors. Therefore, differences from the above transistors will be mainly described to avoid repeated description.

In FIG. 9A to FIG. 9C, the conductor 503 is not provided, and the conductor 505 having a function of a second gate is made to function also as a wiring. The transistor 500D includes the insulator 550 over the oxide 530c and a metal oxide 552 over the insulator 550. The conductor 560 is provided over the metal oxide 552, and an insulator 570 is provided over the conductor 560. An insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be inhibited.

Note that the metal oxide 552 may have a function of part of a first gate. For example, the oxide semiconductor that can be used for the oxide 530 can be used for the metal oxide 552. In that case, when the conductor 560 is deposited by a sputtering method, the electric resistance of the metal oxide 552 is lowered so that the metal oxide 552 can become a conductive layer (the above-described OC electrode).

The metal oxide 552 may have a function of part of a gate insulating film. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Consequently, a gate potential that is applied when the transistor operates can be lowered while the physical thickness is maintained. In addition, the equivalent oxide thickness (EOT) of an insulating layer functioning as a gate insulating film can be reduced.

Although the metal oxide 552 in the transistor 510D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as the gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water or hydrogen is preferably used. For example, aluminum oxide or hafnium oxide is preferably used. Thus, oxidation of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a substrate surface can be greater than or equal to 75° and less than or equal to 100°, preferably greater than or equal to 80° and less than or equal to 95°.

An insulating material having a function of inhibiting the passage of oxygen and impurities such as water or hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to as "impurity regions" or "low-resistance regions".

The region 531a and the region 531b can be formed in a self-aligned manner by using the insulator 571 and/or the conductor 560 as a mask. Thus, the region 531a and/or the region 531b is not overlapped by the conductor 560, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and the impurity element is not added. The offset region can be formed by the addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water or hydrogen can be deposited. For example, aluminum oxide is preferably used for the insulator 574.

Note that an oxide film obtained by a sputtering method may extract hydrogen from the component over which the oxide film is deposited. Thus, the hydrogen concentration in the oxide 530 and the insulator 575 can be reduced when the insulator 574 absorbs hydrogen and water from the oxide 530 and the insulator 575.

Transistor Structure Example 5

Figure 10A:
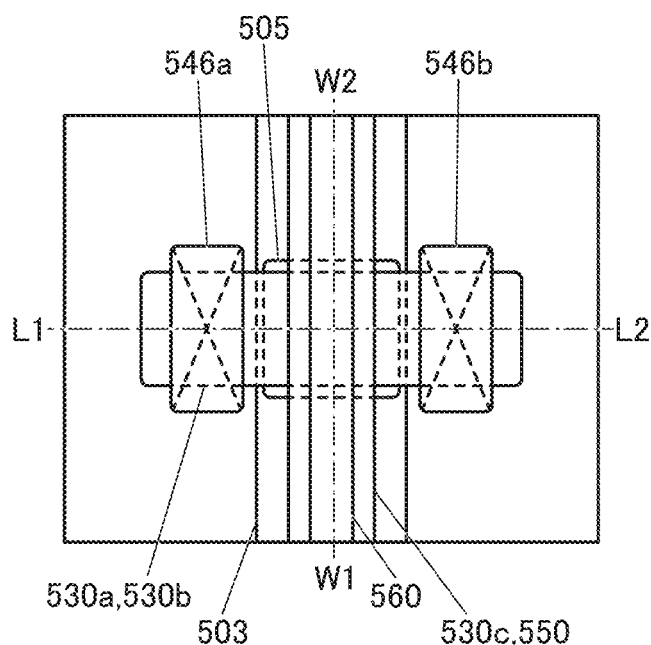
FIG. 10A is a top view illustrating a structure example of a transistor.
Figure 10C:
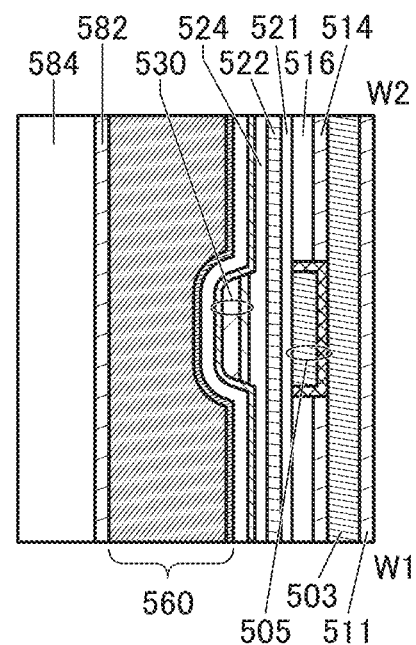
FIG. 10B and FIG. 10C are cross-sectional views illustrating the structure example of the transistor.
Figure 10B:
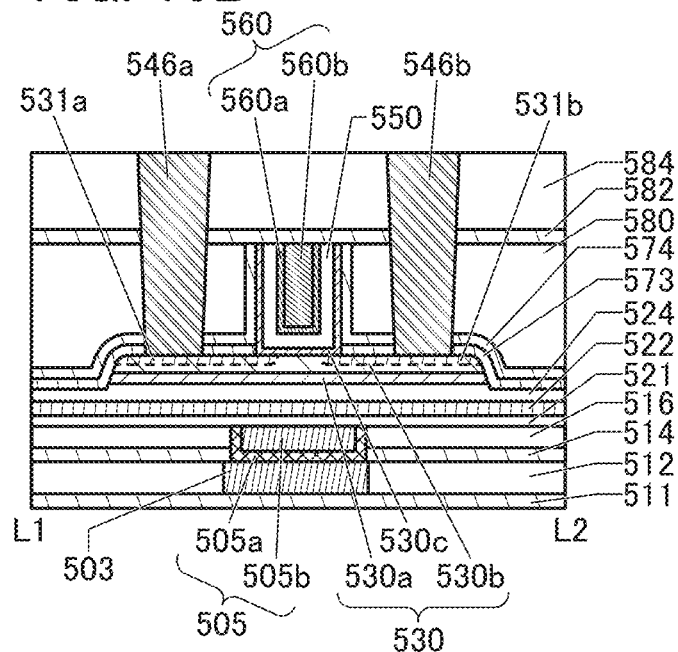

A structure example of a transistor 510E is described with reference to FIG. 10A to FIG. 10C. FIG. 10A is a top view of the transistor 510E. FIG. 10B is a cross-sectional view of a portion indicated by the dashed-dotted line L1-L2 in FIG. 10A. FIG. 10C is a cross-sectional view of a portion indicated by the dashed-dotted line W1-W2 in FIG. 10A. Note that for clarification of the drawing, some components are not illustrated in the top view of FIG. 10A.

The transistor 510E is a variation example of the above transistors. Therefore, differences from the above transistors will be mainly described to avoid repeated description.

In FIG. 10A to FIG. 10C, the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

Regions 531 (the region 531a and the region 531b) illustrated in FIG. 10 are regions where an element described below is added to the oxide 530b. The regions 531 can be formed with the use of a dummy gate, for example.

Specifically, a dummy gate is provided over the oxide 530b, and an element that reduces the resistance of the oxide 530b is added using the dummy gate as a mask. That is, the element is added to regions of the oxide 530 that are not overlapped by the dummy gate, whereby the regions 531 are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the oxide 530c and the insulator 550 overlap the region 531.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening portion provided in the insulator 580, and the region 531 provided in the oxide 530b is partly exposed at the bottom surface of the opening portion. Next, an oxide film to be the oxide 530c, an insulating film to be the insulator 550, and a conductive film to be the conductor 560 are formed in this order in the opening portion, and then the oxide film to be the oxide 530c, the insulating film to be the insulator 550, and the conductive film to be the conductor 560 are partly removed by CMP treatment or the like until the insulator 580 is exposed; thus, the transistor illustrated in FIG. 10 can be formed.

Note that the insulator 573 and the insulator 574 are not essential components. Design is appropriately set in consideration of required transistor characteristics.

The cost of the transistor illustrated in FIG. 10 can be reduced because an existing apparatus can be used and the conductor 542 is not provided.

Transistor Structure Example 6

Figure 11A:
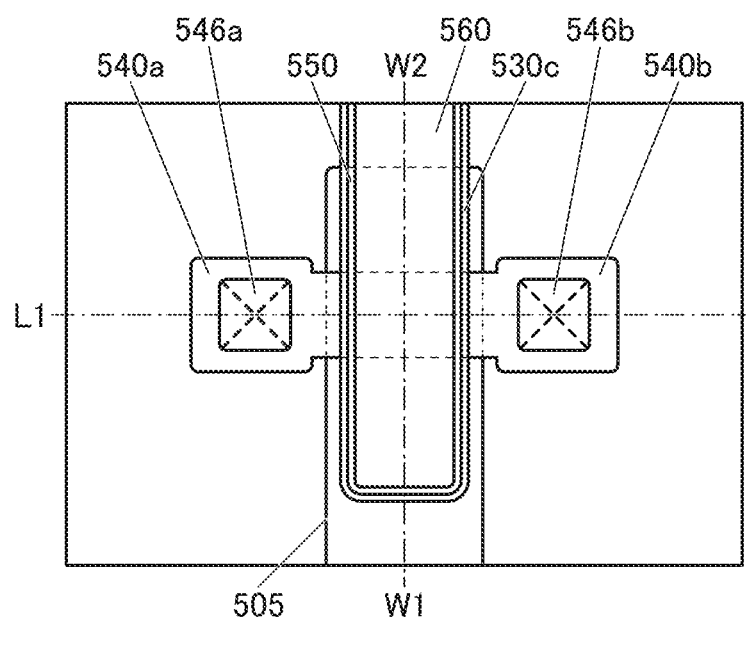
FIG. 11A is a top view illustrating a structure example of a transistor.
Figure 11C:
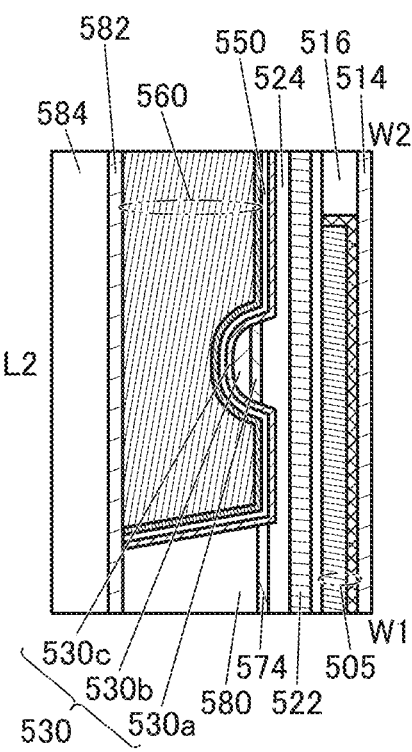
FIG. 11B and FIG. 11C are cross-sectional views illustrating the structure example of the transistor.
Figure 11B:
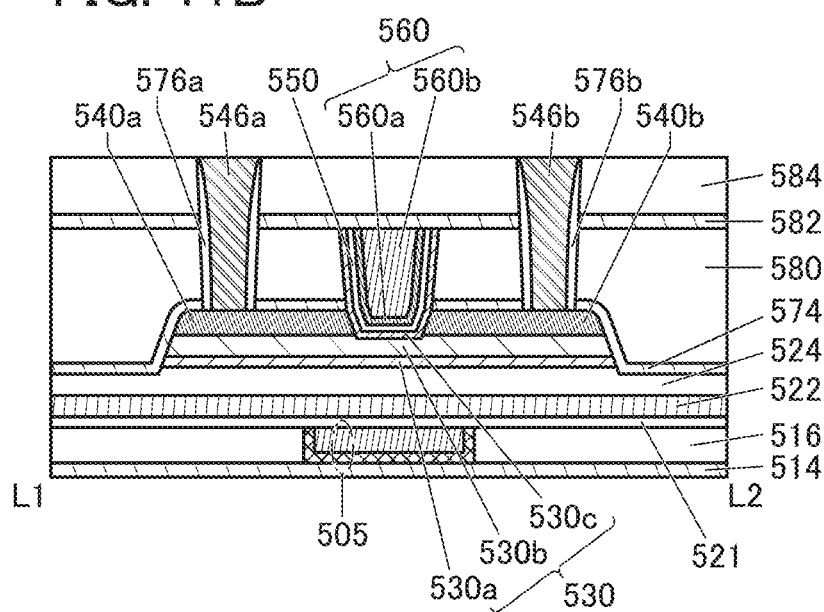

A structure example of a transistor 510F is described with reference to FIG. 11A to FIG. 11C. FIG. 11A is a top view of the transistor 510F. FIG. 11B is a cross-sectional view of a portion indicated by the dashed-dotted line L1-L2 in FIG. 11A. FIG. 11C is a cross-sectional view of a portion indicated by the dashed-dotted line W1-W2 in FIG. 11A. Note that for clarity of the drawing, some components are not illustrated in the top view of FIG. 11A.

The transistor 510F is a variation example of the transistor 510A. Therefore, differences from the above transistor will be mainly described to avoid repeated description.

In the transistor 510A, part of the insulator 574 is provided in the opening portion provided in the insulator 580 and covers the side surface of the conductor 560. Meanwhile, in the transistor 510F, an opening is formed by partly removing the insulator 580 and the insulator 574.

The insulator 576 (the insulator 576a and the insulator 576b) having a barrier property may be provided between the conductor 546 and the insulator 580. Providing the insulator 576 can prevent oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers having different atomic ratios of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures in the manufacturing process (what is called thermal budget).

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic proportion of the element M in the constituent elements in the metal oxide used as the oxide 530c is preferably higher than the atomic proportion of the element M in the constituent elements in the metal oxide used as the oxide 530b. Moreover, the atomic ratio of the element M to In in the metal oxide used as the oxide 530c is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used as the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530c may employ a stacked-layer structure of an In—Ga—Zn oxide and an oxide that does not contain In.

Specifically, as the oxide 530a, a metal oxide having In:Ga:Zn=1:3:4 [atomic ratio] or 1:1:0.5 [atomic ratio] is used. As the oxide 530b, a metal oxide having In:Ga:Zn=4:2:3 [atomic ratio] or 3:1:2 [atomic ratio] is used. As the oxide 530c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as a gate insulator, In diffusion into the insulator 550 would cause poor characteristics of the transistor. Thus, when the oxide 530c has a stacked-layer structure, a highly reliable semiconductor device can be provided.

A metal oxide functioning as an oxide semiconductor is preferably used as the oxide 530. For example, as the metal oxide to be the channel formation region in the oxide 530, a metal oxide having a bandgap of 2 eV or more, preferably 2.5 eV or more is preferably used. With the use of a metal oxide having such a wide bandgap, the off-state current of the transistor can be reduced. With the use of such a transistor, a semiconductor device with low power consumption can be provided.

Note that this embodiment can be implemented in combination with the other embodiments described in this specification as appropriate.

Embodiment 3

In this embodiment, the composition of a metal oxide that can be used in the OS transistor described in the above embodiment will be described.

<Composition of Metal Oxide>

In this specification and the like, CAAC (c-axis aligned crystal) and CAC (Cloud-Aligned Composite) may be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

As an oxide semiconductor used for a semiconductor of a transistor, a thin film having high crystallinity is preferably used. With the use of the thin film, the stability or reliability of the transistor can be improved. Examples of the thin film include a thin film of a single crystal oxide semiconductor and a thin film of a polycrystalline oxide semiconductor. However, to form the thin film of a single crystal oxide semiconductor or the thin film of a polycrystalline oxide semiconductor over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has a periodic atomic arrangement in a microscopic region (e.g., a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Consequently, the thin film of CAAC-IGZO or the thin film of nc-IGZO is preferably used as the semiconductor of the transistor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor having high crystallinity. Meanwhile, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable against high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor has various structures with different properties. An oxide semiconductor of one embodiment of the present invention may include two or more of an amorphous oxide semiconductor, a polycrystalline oxide semiconductor, the a-like OS, the nc-OS, and the CAAC-OS.

<Transistor Including Oxide Semiconductor>

Next, the case where the above oxide semiconductor is used in a transistor will be described.

When the above oxide semiconductor is used in a transistor, a transistor having high field-effect mobility can be achieved. In addition, a transistor having high reliability can be achieved.

Non-Patent Document 6 shows that the transistor using the above oxide semiconductor has an extremely low leakage current in a non-conduction state, and specifically, the off-state current per micrometer in the channel width of the transistor is on the order of yA/μm ($10^{-24}$ A/μm). For example, a low-power-consumption CPU utilizing a characteristic of a low leakage current of the transistor using an oxide semiconductor is disclosed (see Non-Patent Document 7).

Furthermore, application of a transistor using an oxide semiconductor to a display device that utilizes the characteristic of a low leakage current of the transistor has been reported (see Non-Patent Document 8). In the display device, a displayed image is changed several tens of times per second. The number of times images are changed in one second is referred to as a refresh rate. The refresh rate is also referred to as drive frequency. Such high-speed screen change that is hard for human eyes to recognize is considered as a cause of eyestrain. Accordingly, reducing the number of times of image rewriting by lowering the refresh rate of the display device is proposed. Moreover, driving with a lowered refresh rate can reduce the power consumption of the display device. Such a driving method is referred to as idling stop (IDS) driving.

Furthermore, an oxide semiconductor having a low carrier concentration is preferably used in a transistor. To reduce the carrier concentration of an oxide semiconductor film, the impurity concentration in the oxide semiconductor film is lowered so that the density of defect states can be reduced. In this specification and the like, a state with a low impurity concentration and a low density of defect states is referred to as a highly purified intrinsic or substantially highly purified intrinsic state.

Moreover, a highly purified intrinsic or substantially highly purified intrinsic oxide semiconductor film has a low density of defect states and accordingly may have a low density of trap states. Note that the carrier concentration of an oxide semiconductor that can be used in one embodiment of the present invention is within the range described in Embodiment 2.

Charges trapped by the trap states in an oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of a transistor, reducing the concentration in an oxide semiconductor is effective. In addition, in order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are lower than or equal to $2\times10^{18}$ atoms/cm$^{-3}$, preferably lower than or equal to $2\times10^{17}$ atoms/cm$^{-3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is lower than or equal to $1\times10^{18}$ atoms/cm$^{-3}$, preferably lower than or equal to $2\times10^{16}$ atoms/cm$^{-3}$.

When containing nitrogen, the oxide semiconductor easily becomes n-type by generation of electrons serving as carriers and an increase in carrier concentration. Thus, a transistor that uses an oxide semiconductor containing nitrogen as a semiconductor is likely to have normally-on characteristics. For this reason, nitrogen in the oxide semiconductor is preferably reduced as much as possible. For example, the nitrogen concentration in the oxide semiconductor is lower than $5\times10^{19}$ atoms/cm$^{-3}$, preferably lower than or equal to $5\times10^{18}$ atoms/cm$^{-3}$, further preferably lower than or equal to $1\times10^{18}$ atoms/cm$^{-3}$, still further preferably lower than or equal to $5\times10^{17}$ atoms/cm$^{-3}$ in SIMS.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. For this reason, hydrogen in the oxide semiconductor is preferably reduced as much as possible. Specifically, the hydrogen concentration in the oxide semiconductor obtained by SIMS is lower than $1\times10^{20}$ atoms/cm$^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$.

When an oxide semiconductor with sufficiently reduced impurities is used for a channel formation region of a transistor, stable electrical characteristics can be given.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of low leakage current of the transistor have been studied.

Note that this embodiment can be implemented in combination with the other embodiments described in this specification as appropriate.

Example

In this example, a potential VC generated using a jig was supplied to the wiring VBP_IN of the semiconductor device 100 described in the above embodiment, and its relation with a potential output from the output terminal S_OUT was examined.

The potential VC is a potential imitating the positive electrode potential VBP of a secondary battery, and sometimes causes a potential drop (denoted as "MS" in FIG. 12B) corresponding to a micro-short circuit. A potential supplied to the wiring VBM_IN was set to 0 V, and the potential VB1 and the potential VB2 were set so that the potential difference between the node N11 and the node N12 was 40 mV.

Figure 12A:
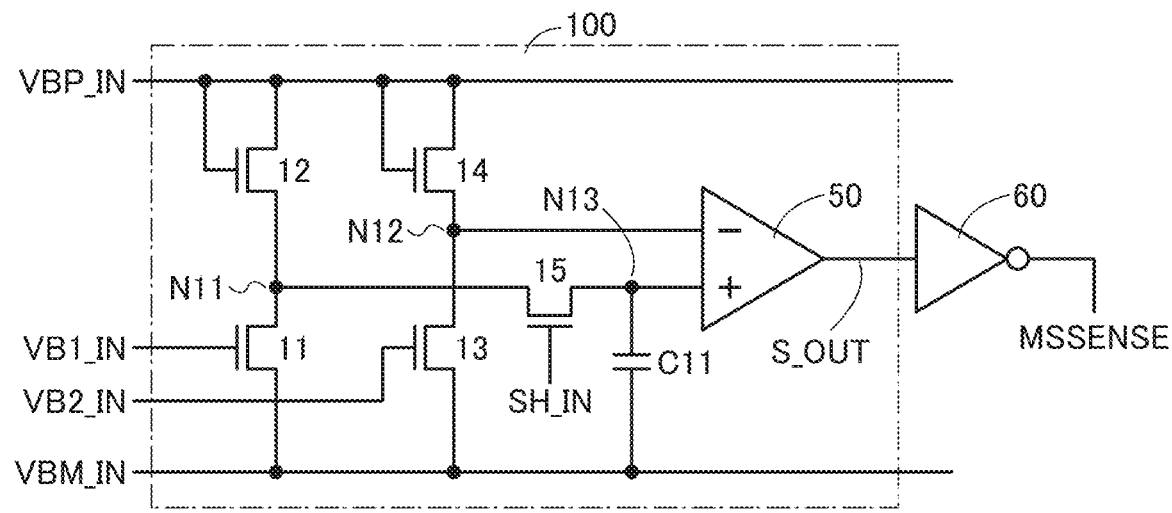
FIG. 12A is a diagram illustrating a circuit subjected to measurement with an oscilloscope.

Note that in practice, to amplify the potential output from the output terminal S_OUT, the potential output from the output terminal S_OUT was input to an inverter 60, and a potential MSSENSE output from the inverter 60 was measured with an oscilloscope (see FIG. 12A).

Figure 12B:
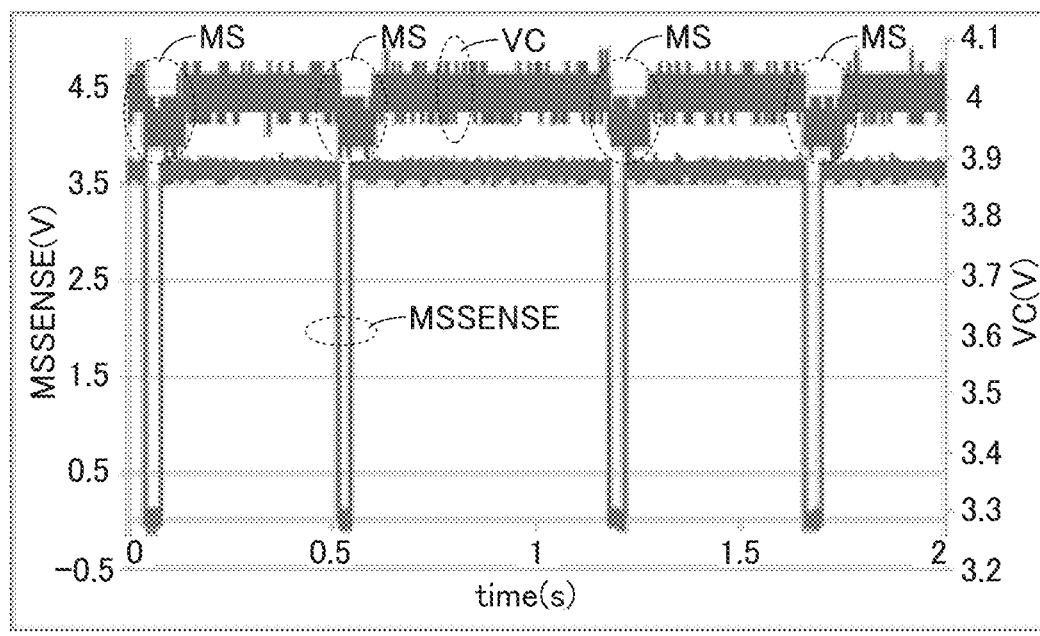
FIG. 12B is a diagram showing results of the measurement with an oscilloscope.

FIG. 12B shows the results of the measurement using an oscilloscope. In FIG. 12B, the horizontal axis represents time (denoted as "time(s)" in FIG. 12B), and the vertical axis represents potential. Note that in FIG. 12B, the potential VC (denoted as "VC(V)" in FIG. 12B) is shown on the right vertical axis, and the potential MSSENSE (denoted as "MSSENSE(V)" in FIG. 12B) is shown on the left vertical axis.

In FIG. 12B, the potential drop corresponding to a micro-short circuit was 50 mV. That is, the potential VC is approximately 4 V but sometimes becomes a potential lower by 50 mV. It is found from FIG. 12B that the potential MSSENSE is normally a high-level potential but becomes a low-level potential when the potential VC becomes a potential lower by 50 mV.

The potential MSSENSE, which is output from the inverter 60, is a potential whose logic is inverted from the logic of the potential output from the output terminal S_OUT. That is, the potential output from the output terminal S_OUT is found to be similar to that in the timing chart in FIG. 3E.

At least part of the structure, the method, and the like described in this example can be implemented in appropriate combination with other embodiments described in this specification.

REFERENCE NUMERALS

C11: capacitor, CM0_IN: input terminal, CM1_IN: input terminal, CM1_OUT: output terminal, CP0_IN: input terminal, CP0_OUT: output terminal, CP1_IN: input terminal, CP1_OUT: output terminal, MSSENSE: potential, N11: node, N12: node, N13: node, R11: resistor, R12: resistor, VB1: potential, VB1_IN: wiring, VB2: potential, VB2_IN: wiring, VB3: potential, VB3_IN: wiring, VC: potential, VD1: initial potential, 11: transistor, 12: transistor, 13: transistor, 14: transistor, 15: transistor, 21: transistor, 22: transistor, 23: transistor, 24: transistor, 25: transistor, 26: transistor, 27: transistor, 28: transistor, 29: transistor, 50: comparator, 60: inverter, 51: amplifier, 100: semiconductor device, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 505: conductor, 505a: conductor, 505b: conductor, 510: insulator, 510A: transistor, 510B: transistor, 510C: transistor, 510D: transistor, 510E: transistor, 510F: transistor, 511: insulator, 512: insulator, 514: insulator, 516: insulator, 518: conductor, 520: insulator, 521: insulator, 522: insulator, 524: insulator, 530: oxide, 530a: oxide, 530b: oxide, 530c: oxide, 531: region, 531a: region, 531b: region, 540a: conductor, 540b: conductor, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 552: metal oxide, 560: conductor, 560a: conductor, 560b: conductor, 570: insulator, 571: insulator, 573: insulator, 574: insulator, 575: insulator, 576: insulator, 576a: insulator, 576b: insulator, 580: insulator, 581: insulator, 582: insulator, 584: insulator, 586: insulator, 600: capacitor, 610: conductor, 612: conductor, 620: conductor, 630: insulator, 650: insulator

The invention claimed is:

1. A semiconductor device comprising:
a first source follower comprising a first transistor and a second transistor;
a second source follower comprising a third transistor and a fourth transistor;
a fifth transistor;
a capacitor; and
a comparator,
wherein one of a source and a drain of the first transistor and one of a source and a drain of the second transistor are electrically connected to one of a source and a drain of the fifth transistor,
wherein one of a source and a drain of the third transistor and one of a source and a drain of the fourth transistor are electrically connected to an inverting input terminal of the comparator, and
wherein the other of the source and the drain of the fifth transistor is electrically connected to one terminal of the capacitor and a non-inverting input terminal of the comparator.

2. The semiconductor device according to claim 1, wherein each of the first transistor, the second transistor, the third transistor, the fourth transistor, and the fifth transistor comprises a metal oxide in a channel formation region.

3. The semiconductor device according to claim 1,
wherein a first potential is input to a gate of the first transistor, and
wherein a second potential is input to a gate of the third transistor.

4. The semiconductor device according to claim 3, wherein the first potential is higher than the second potential.

5. The semiconductor device according to claim 1,
wherein the other of the source and the drain of the first transistor and the other of the source and the drain of the third transistor are electrically connected to a first wiring,
wherein the other of the source and the drain of the second transistor, a gate of the second transistor, the other of the source and the drain of the fourth transistor, and a gate of the fourth transistor are electrically connected to a second wiring,
wherein a negative electrode potential of a secondary battery is supplied to the first wiring, and
wherein a positive electrode potential of the secondary battery is supplied to the second wiring.

6. The semiconductor device according to claim 1,
wherein the comparator comprises a sixth transistor, and
wherein the sixth transistor comprises a metal oxide in a channel formation region.

7. A semiconductor device comprising:
first to fifth transistors;
a capacitor;
a comparator; and
first and second wirings,
wherein one of a source and a drain of the first transistor and one of a source and a drain of the second transistor are electrically connected to the one of a source and a drain of the fifth transistor,
wherein one of a source and a drain of the third transistor and one of a source and a drain of the fourth transistor are electrically connected to an inverting input terminal of the comparator,
wherein the other of the source and the drain of the first transistor and the other of the source and the drain of the third transistor are electrically connected to the first wiring,
wherein the other of the source and the drain of the second transistor, a gate of the second transistor, the other of the source and the drain of the fourth transistor, and a gate of the fourth transistor are electrically connected to the second wiring, and
wherein the other of the source and the drain of the fifth transistor is electrically connected to one terminal of the capacitor and a non-inverting input terminal of the comparator.

8. The semiconductor device according to claim 7, wherein each of the first transistor, the second transistor, the third transistor, the fourth transistor, and the fifth transistor comprises a metal oxide in a channel formation region.

9. The semiconductor device according to claim 7,
wherein a first potential is input to a gate of the first transistor, and
wherein a second potential is input to a gate of the third transistor.

10. The semiconductor device according to claim 9, wherein the first potential is higher than the second potential.

11. The semiconductor device according to claim 7,
wherein a negative electrode potential of a secondary battery is supplied to the first wiring, and
wherein a positive electrode potential of the secondary battery is supplied to the second wiring.

12. The semiconductor device according to claim 7, wherein the comparator comprises a sixth transistor, and wherein the sixth transistor comprises a metal oxide in a channel formation region.

* * * * *